US012805114B2

(12) United States Patent
Kajimoto et al.

(10) Patent No.: US 12,805,114 B2
(45) Date of Patent: Nov. 17, 2026

(54) LIGHT EMITTING APPARATUS, DISPLAY APPARATUS, IMAGING APPARATUS, AND ELECTRONIC DEVICE

(71) Applicant: CANON KABUSHIKI KAISHA, Tokyo (JP)

(72) Inventors: Norifumi Kajimoto, Kanagawa (JP); Koji Ishizuya, Kanagawa (JP); Takayuki Ito, Kanagawa (JP); Hiroaki Sano, Tokyo (JP); Yojiro Matsuda, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 315 days.

(21) Appl. No.: 18/758,711

(22) Filed: Jun. 28, 2024

(65) Prior Publication Data

US 2024/0357850 A1 Oct. 24, 2024

Related U.S. Application Data

(63) Continuation of application No. PCT/JP2022/000068, filed on Jan. 5, 2022.

(51) Int. Cl.

*H10K 50/11* (2023.01)
*G02B 27/01* (2006.01)

(Continued)

(52) U.S. Cl.

CPC ....... *H10K 50/115* (2023.02); *G02B 27/0172* (2013.01); *H10K 50/852* (2023.02); *H10K 50/858* (2023.02); *G02B 2027/0178* (2013.01)

(58) Field of Classification Search

CPC .. H10K 50/115; H10K 50/852; H10K 50/858; H10K 59/876; H10K 59/879;

(Continued)

(56) References Cited

U.S. PATENT DOCUMENTS

2004/0140757 A1* 7/2004 Tyan .................... H10K 50/852 313/504
2004/0160172 A1* 8/2004 Tyan .................... H10K 59/876 313/506

(Continued)

FOREIGN PATENT DOCUMENTS

CN 112652728 A 4/2021
JP 2011-134726 A 7/2011

(Continued)

*Primary Examiner* — S M Sohel Imtiaz

(74) *Attorney, Agent, or Firm* — Canon U.S.A., IP Division

(57) ABSTRACT

A light emitting apparatus includes an insulation layer, a light emitting element including a luminescent material, and having a resonator structure, the luminescent material having a photoluminescence (PL) spectrum with a first peak at a wavelength λPL, and a lens on the light emitting element, wherein the light emitting apparatus includes an electrode configured to supply charge to the luminescent material, and ends portion of the electrode are covered with a pixel separation layer, and wherein a resonance peak wavelength λon of an interference spectrum that intensifies light to be emitted in a direction perpendicular to the main surface in the resonator structure, a peak wavelength λEL of EL emission radiated via a light extraction structure, and the λPL satisfy the following inequality (1):

$$|\lambda EL - \lambda PL| < |\lambda on - \lambda PL|. \tag{1}$$

27 Claims, 19 Drawing Sheets

(51) Int. Cl.

| | |
|---|---|
| ***H10K 50/115*** | (2023.01) |
| ***H10K 50/852*** | (2023.01) |
| ***H10K 50/858*** | (2023.01) |

(58) Field of Classification Search

CPC ........ G02B 27/0172; G02B 2027/0178; H05B 33/02; H05B 33/12; H05B 33/24

See application file for complete search history.

(56) References Cited

U.S. PATENT DOCUMENTS

| | | | | |
|---|---|---|---|---|
| 2010/0201256 | A1* | 8/2010 | Xue | H05B 33/22 313/504 |
| 2011/0261849 | A1* | 10/2011 | Shinagawa | H01S 5/2201 372/45.01 |
| 2019/0211260 | A1* | 7/2019 | Won | C08L 57/10 |
| 2020/0388780 | A1* | 12/2020 | Niboshi | G09F 9/30 |
| 2021/0102119 | A1* | 4/2021 | Kim | C09K 11/883 |
| 2023/0104604 | A1* | 4/2023 | Kaneko | G09F 9/00 257/40 |

FOREIGN PATENT DOCUMENTS

| | | | |
|---|---|---|---|
| JP | 2012-134128 | A | 7/2012 |
| JP | 2015-46280 | A | 3/2015 |
| JP | 2017017013 | A | 1/2017 |
| JP | 2021-136207 | A | 9/2021 |

* cited by examiner

LIGHT EMITTING APPARATUS, DISPLAY APPARATUS, IMAGING APPARATUS, AND ELECTRONIC DEVICE

CROSS-REFERENCE TO RELATED APPLICATIONS

This application is a Continuation of International Patent Application No. PCT/JP2022/000068, filed Jan. 5, 2022, which is hereby incorporated by reference herein in its entirety.

BACKGROUND OF THE INVENTION

Field of the Invention

The present invention relates to a light emitting apparatus, a display apparatus, an imaging apparatus, and electronic device.

Background Art

An organic light emitting element (also referred to as "organic electroluminescent (organic EL) element" or organic light emitting diode [OLED]) is an electron element including a pair of electrodes and an organic compound layer between the electrodes. Injection of electrons and holes from the pair of electrodes into the organic compound layer generates an excitation of luminescent organic compounds in the organic compound layer, and when the excitation returns to the ground state, the organic light emitting element emits light. There have been remarkable advancements in organic light emitting elements, and efforts are being made to lower driving voltages, realize a variety of emission wavelengths, achieve high-speed responsiveness, and reduce the thickness and weight of light emitting elements. In an organic light emitting element, a substantial quantity of light is trapped within the device and not extracted to the outside, so that the light extraction efficiency of organic light emitting elements is low. To improve light extraction efficiency, some organic light emitting elements include a light extraction structure, such as microlenses. PTL 1 discusses an organic light emitting device provided with microlenses as an outcoupling component to increase an amount of light extracted from an OLED. A microlens diameter and a distance between the lenses and a light emitting region in the organic light emitting element in PTL 1 are defined to address low contrast resulting from optical crosstalk and/or backscattering.

CITATION LIST

Patent Literature

PTL 1: Japanese Patent Laid-Open No. 2017-17013

However, interference conditions are not defined for the organic light emitting element in PTL 1, and the structure is not sufficient for emission of desired light in a normal direction (i.e., front direction) of a substrate.

SUMMARY OF THE INVENTION

The present invention is devised based on the above-described issue and is directed to providing an organic light emitting element including a light extraction structure, such as microlenses and using optical interference with the light extraction structure reflected, to provide a high radiance in a front direction.

According to an aspect of the present invention, A light emitting apparatus includes a substrate, an insulation layer on a main surface of the substrate, a light emitting element disposed on a main surface of the insulation layer, including a luminescent material, and having a resonator structure, the luminescent material having a photoluminescence (PL) spectrum with a first peak at a wavelength $\lambda_{PL}$ within a visible light range, and a lens on the light emitting element, wherein the light emitting apparatus includes, between the main surface of the insulation layer and the luminescent material, an electrode configured to supply charge to the luminescent material, and an end portion of the electrode and another end of the electrode are covered with a pixel separation layer, and wherein a resonance peak wavelength $\lambda_{on}$ of an interference spectrum that intensifies light to be emitted in a direction perpendicular to the main surface in the resonator structure, a peak wavelength $\lambda_{EL}$ of EL emission radiated via the lens, and the $\lambda_{PL}$ satisfy the following inequality (1):

$$|\lambda_{EL} - \lambda_{PL}| < |\lambda_{on} - \lambda_{PL}|. \quad (1)$$

Further features of the present invention will become apparent from the following description of exemplary embodiments with reference to the attached drawings.

DESCRIPTION OF THE EMBODIMENTS

Figure 1A:
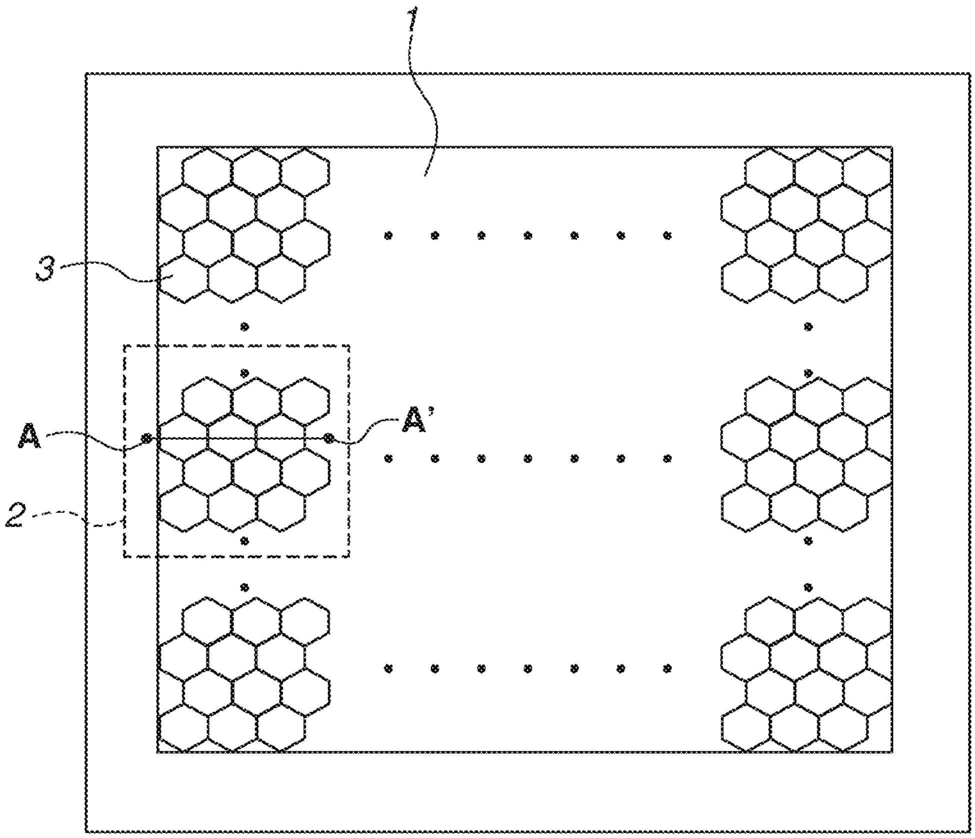
FIG. 1A is a plan view illustrating a light emitting apparatus according to an exemplary embodiment of the present invention.

A light emitting apparatus according to an exemplary embodiment of the present invention includes an interference structure of an organic film that is adapted to an inclined part of a light extraction structure, which makes it possible to increase the radiant intensity of an organic electroluminescent (organic EL) element including the light extraction structure in a front direction. This is because light of a photoluminescence (PL) peak wavelength of a luminescent material is effectively intensified and refracted at the inclined part of the light extraction structure in the front direction. The light emitting apparatus includes an electrode configured to supply charge to the luminescent material between a main surface of an insulation layer and the luminescent material, and an end portion and the other end of the electrode are covered with a pixel separation layer.

Specifically, a light emitting apparatus according to an exemplary embodiment of the present invention includes an insulation layer, a light emitting element disposed on a main surface of the insulation layer, including a luminescent material having a PL spectrum with a first peak at a wavelength of $\lambda_{PL}$ within the visible light range, and having a resonator structure, and a light extraction structure on the light emitting element, wherein a resonance peak wavelength $\lambda_{on}$ of an interference spectrum that intensifies light to be emitted in a direction perpendicular to the main surface in the resonator structure, a peak wavelength $\lambda_{EL}$ of EL emission radiated via a light extraction structure, and the $\lambda_{PL}$ satisfy the following inequality (1):

$$|\lambda_{EL}-\lambda_{PL}|<|\lambda_{on}-\lambda_{PL}|. \tag{1}$$

A light emitting apparatus according to an exemplary embodiment of the present invention includes an insulation layer, a light emitting element disposed on a main surface of the insulation layer, including a luminescent material having a PL spectrum with a first peak at a wavelength of $\lambda_{PL}$ within the visible light range, and having a resonator structure, and a light extraction structure on the light emitting element, wherein a resonance peak wavelength $\lambda_{on}$ of an interference spectrum that intensifies light to be emitted in a direction perpendicular to the main surface in the resonator structure, a resonance peak wavelength $\lambda_{off}$ of an interference spectrum that intensifies light to be emitted in a direction perpendicular to the main surface as a result of refraction in the light extraction structure, and the $\lambda_{PL}$ satisfy the following inequality (2):

$$|\lambda_{off}-\lambda_{PL}|<|\lambda_{on}-\lambda_{PL}|. \tag{2}$$

According to another exemplary embodiment, $\lambda_{off}$ may be a distance from a light emitting region to a lower end of an upper electrode of the light emitting element in a direction of a curved surface of the light extraction structure, and $\lambda_{on}$ may be a distance from the light emitting region to the lower end of the upper electrode of the light emitting element in a direction perpendicular to the insulation layer. Actual distances are used, so that it becomes easy to design.

A light emitting apparatus according to an exemplary embodiment of the present invention will be described below with reference to the accompanying drawings. Known technologies in the technical field are applicable to those that are not specifically illustrated or described in the present specification. The present invention is not limited to the exemplary embodiment described below.

FIG. 1A is a plan view illustrating the light emitting apparatus according to an exemplary embodiment of the present invention. According to the present exemplary embodiment, the light emitting apparatus is a display apparatus in which a plurality of light emitting elements including a first light emitting element and a second light emitting element is arranged and emits a different color from each other to display an image. The display apparatus includes a display region 1 where light emitting elements 3 are arranged two-dimensionally on a main surface of an insulation layer, such as a substrate, and display an image. While the light emitting elements 3 are arranged in a delta array in FIGS. 1A and 1B, the light emitting elements 3 may be arranged in a stripe array, square array, pentile array, or Bayer array. An end portion of the display region 1 is indicated with a dashed line and specified as an end portion 2.

Figure 1B:
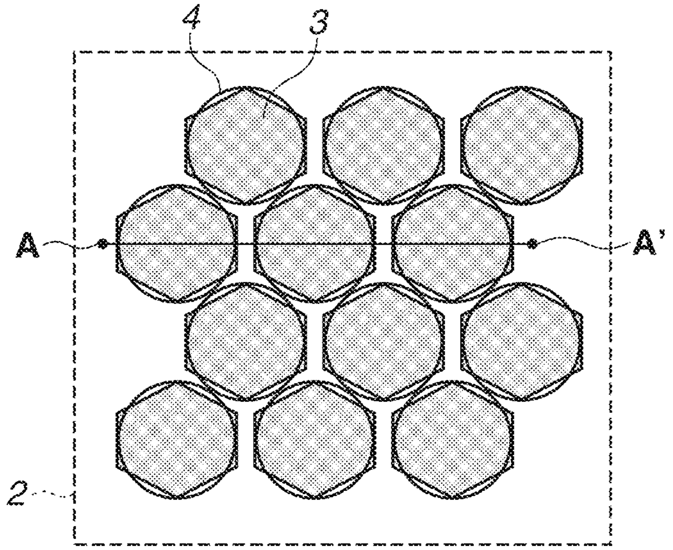
FIG. 1B is an enlarged view illustrating a portion surrounded by a dashed line in FIG. 1A.

FIG. 1B is an enlarged view illustrating the dashed line portion specified as the end portion 2 in FIG. 1A. The light emitting elements 3 disposed on the main surface of the insulation layer and light extraction structures 4 on which light from light emitting regions of the light emitting elements 3 is incident are included. In FIG. 1B, centers of the light emitting regions match the light extraction structures 4 in a plan view from a direction perpendicular to the main surface of the substrate. While the light emitting regions are hexagonally shaped according to the present exemplary embodiment, shapes of the light emitting regions are not limited. In a case where the light emitting regions are polygonal, centers of inscribed circles of the polygons may be estimated as centers of the light emitting regions. In a case where the light emitting regions are circular, centers of the circles may be estimated as centers of the light emitting regions.

Figure 2A:
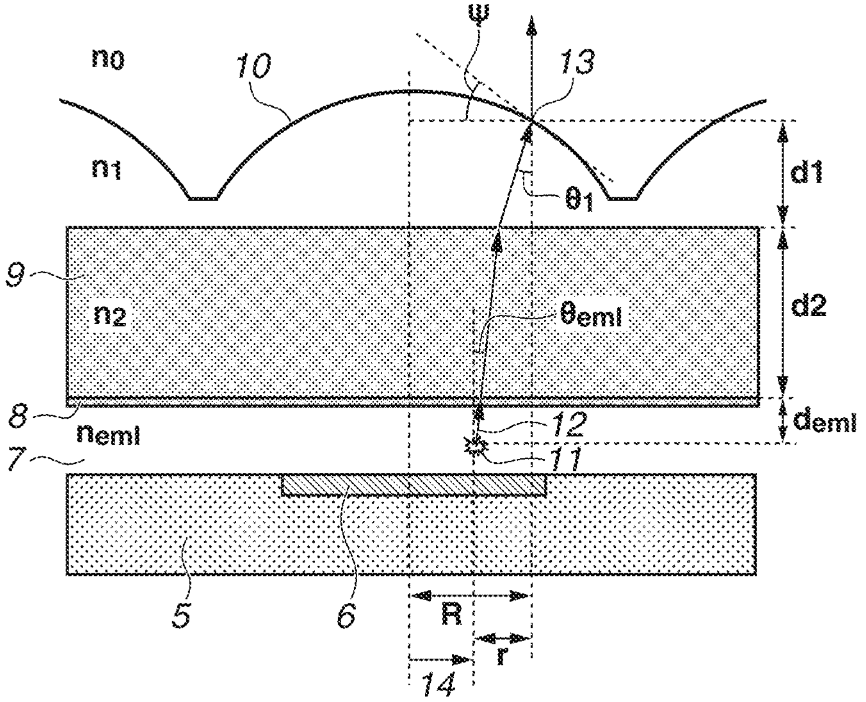
FIG. 2A is a schematic diagram illustrating a cross section in a case where a light extraction structure of a light emitting apparatus includes microlenses that are convex toward the direction away from a substrate.
Figure 2B:
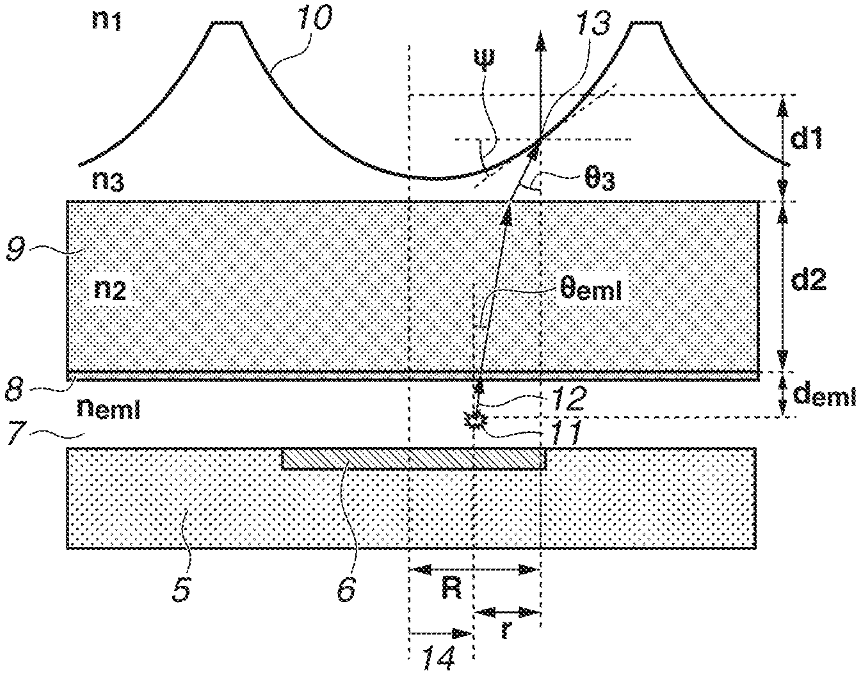
FIG. 2B is a schematic diagram illustrating a cross section in a case where a light extraction structure of a light emitting apparatus includes microlenses that are convex toward the direction approaching the substrate.

FIGS. 2A and 2B are a schematic diagram illustrating a cross section of the light emitting apparatus according to an exemplary embodiment of the present invention. The schematic diagram illustrating the cross section of here refers to an arrangement when the light emitting elements 3 are viewed in the direction perpendicular to the main surface of the insulation layer (normal direction of the main surface). FIG. 2A illustrates an example in which the light extraction structures 4 of the light emitting apparatus are microlenses that are convex toward the direction away from the substrate. The light emitting elements 3 according to the present exemplary embodiment each include, on a substrate 5, a reflection layer 6, an organic layer 7 including a luminescent material, a semi-transparent electrode 8, a protection layer 9, and microlenses 10. The reflection layer 6 and the semi-transparent electrode 8 are also referred to as a lower electrode and an upper electrode, respectively, because of their placement positions. A PL spectrum of the luminescent material has a first peak at a wavelength of $\lambda_{PL}$ within the visible light range. The light emitting elements 3 may have a resonator structure to reinforce light emission through an optical distance between the reflection layer 6 and the semi-transparent electrode 8. While the organic layer 7 is used and described here, any light emitting element can be used whether it is an organic or inorganic light emitting element. In a case where the luminescent material is an organic luminescent material, the light emitting apparatus according to the present exemplary embodiment may be referred to as an organic light emitting apparatus, and the light emitting elements 3 may be referred to as organic light emitting elements. According to the present exemplary embodiment, the reflection layer 6 also serves as an electrode, so that the reflection layer 6 may also be referred to as a reflection electrode.

The resonator structure has a resonance peak wavelength $\lambda_{on}$ of an interference spectrum that intensifies light to be emitted in the direction perpendicular to the main surface of the substrate 5. The light emission in the direction perpendicular to the main surface of the substrate 5 can also be referred to as light that is extracted in the direction perpendicular to the main surface of the substrate 5 in a state without the light extraction structure 4, specifically, light to be emitted in the front direction of the substrate 5 without refraction in the light extraction structure 4. Further, the resonator structure has a peak wavelength $\lambda_{EL}$ of EL emission that is radiated via the light extraction structure 4. The peak wavelength $\lambda_{EL}$ is a wavelength of light to be emitted in the front direction of the substrate 5, in view of optical interference by the resonator structure and refraction in the light extraction structure 4. Photoluminescence (PL) emission and PL spectra are properties of the luminescent material without the structure of the light emitting elements 3. A PL spectrum can be obtained by, for example, forming a light emitting layer including a luminescent material of an organic light emitting element on a substrate and exciting the light emitting layer to emit light. While it is desirable to reproduce the light emitting layer, PL emission is still measurable with a solid film of the luminescent material. EL emission and EL spectra have light emission characteristics in view of the optical distance between the electrodes and influences of the light extraction structure 4.

The light emitting apparatus according to the present exemplary embodiment is a light emitting apparatus with $\lambda_{PL}$, which is the first peak of the luminescent material, $\lambda_{EL}$, and $\lambda_{on}$ that satisfy the following inequality (1):

$$|\lambda_{EL}-\lambda_{PL}|<|\lambda_{on}-\lambda_{PL}|. \quad (1)$$

Satisfying inequality (1) makes it possible to obtain a light emitting apparatus with excellent luminance of light emission in the front direction of the substrate 5.

Satisfying inequality (1) indicates that the difference between the wavelength of the EL emission and the first peak wavelength $\lambda_{PL}$ of the luminescent material is less than the difference between the interference peak wavelength $\lambda_{on}$ and the first peak wavelength $\lambda_{PL}$ of the luminescent material.

$|\lambda_{on}-\lambda_{PL}|$ may be less than the full width at half maximum of $\lambda_{PL}$.

The resonator structure of the light emitting apparatus according to the present exemplary embodiment has a resonance peak wavelength $\lambda_{off}$ of an interference spectrum that intensifies light to be emitted in the direction perpendicular to the main surface of the substrate 5 as a result of refraction in the light extraction structure 4. Light emitted in the front direction of the substrate 5 as a result of refraction in the light extraction structure 4 is light that is emitted in a light emission direction from the luminescent material, and a reflection direction at the reflection layer 6 is light inclined with respect to the main surface of the substrate 5. In FIG. 2A, radiated light 12 is emitted from a point 11 at which the luminescent material emits light. The radiated light 12 is refracted at an inclined part 13 of the microlenses 10 and emitted in the front direction of the substrate 5.

The light emitting apparatus according to the present exemplary embodiment is a light emitting apparatus with $\lambda_{PL}$, $\lambda_{off}$, and $\lambda_{on}$ that satisfy the following inequality (2):

$$|\lambda_{off}-\lambda_{PL}|<|\lambda_{on}-\lambda_{PL}|. \tag{2}$$

Satisfying inequality (2) makes it possible to obtain a light emitting apparatus with excellent luminance of light emission in the front direction of the substrate 5.

Inequality (2) indicates that the difference between the interference peak $\lambda_{off}$ and the first peak wavelength of the luminescent material is less than the difference between the interference peak $\lambda_{on}$ and the first peak wavelength of the luminescent material. In other words, it is indicated that the first peak wavelength of the luminescent material is closer to the interference peak that intensifies light to be emitted through the light extraction structure 4 in the front direction of the substrate 5 than to the interference peak that intensifies light to be emitted in the front direction of the substrate 5. In other words, the interference peak that intensifies light emitted at an angle inclined with respect to the substrate 5 is close to the first peak of the luminescent material. Here, the first peak may be a peak with the highest intensity in the PL spectrum of the luminescent material in the visible range. In a case where the PL spectrum has a second peak, the second peak may be a peak with the second highest intensity after the first peak. The luminescent material is also referred to as a light emitting dopant. $|\lambda_{on}-\lambda_{PL}|$ may be less than or equal to the full width at half maximum of $\lambda_{PL}$.

In a case where there is a second peak, it is desirable to satisfy the following inequality (3):

$$|\lambda_{off}-\lambda_{PL}|\leq|\lambda_{on}-\lambda_{PL2}|, \tag{3}$$

where $\lambda_{PL2}$ is a wavelength of the second peak.

Inequality (3) indicates that the difference between the interference peak $\lambda_{off}$ and the first peak $\lambda_{PL}$ is less than the difference between the interference peak $\lambda_{on}$ and the second peak $\lambda_{PL2}$. In other words, design may be made based on the interference peaks with the first peak prioritized over the second peak. The first peak may match $\lambda_{off}$, and the second peak may match $\lambda_{on}$. If inequality (3) is satisfied, the luminance on the front of the substrate 5 is further improved, so that this is desirable. $|\lambda_{on}-\lambda_{PL2}|$ may be less than or equal to the full width at half maximum of the second peak.

Alternatively, the light emitting apparatus may include a second light emitting element different from the light emitting element, and the second light emitting element may be an element that does not satisfy inequality (1). The second light emitting element may be an element that emits light of a luminous color different from the light emitting element. Since the light emitting element emits light of a different color, in view of the balance of luminance on the front, a light emitting element that satisfies neither one of inequalities (1) and (2) may be included. The luminous color of the second light emitting element that satisfies neither one of inequalities (1) and (2) may be determined based on a balance of red (R), green (G), and blue (B) of the light emitting apparatus or may be a combination of blue, green, and red.

In the light emitting apparatus according to an exemplary embodiment of the present invention, an element that prioritizes the luminance on the front may satisfy inequality (1) or (2) and inequality (3), and an element that prioritizes color purity may be a device that does not satisfy inequality (3). Further, the element that prioritizes color purity does not have to satisfy inequalities (1) and (2).

The element that prioritizes the luminance at the front may be an element that emits green light, and the element that prioritizes color purity may be an element that emits blue light. In another exemplary embodiment, the element that prioritizes the luminance at the front may be an element that emits blue light, and the element that prioritizes color purity may be an element that emits green light. In yet another exemplary embodiment, the element that prioritizes the luminance at the front may be an element that emits red light, and the element that prioritizes color purity may be an element that emits green light or an element that emits blue light.

The second light emitting element may include a second luminescent material different from the luminescent material of the first light emitting element.

The full width at half maximum of the PL spectrum of the second luminescent material may include a width greater than or equal to the full width at half maximum of the PL spectrum of the luminescent material included in the first light emitting element.

Here, the full width at half maximum of a PL spectrum refers to the width of a first peak at an intensity of 0.5 in a case where the PL intensity of the first peak is 1. For a luminescent material with a wide spectral width between first and second peaks of the luminescent material, a minimum value of the PL intensity of a boundary region between the first and second peaks may be 0.5 or greater. In such a case, the full width at half maximum corresponds to a spectral width at an intensity of 0.5 with respect to a spectrum obtained by adding spectral components of the first and second peaks. In a case where the spectral width at the first peak is significantly large, it may appear as if there is no second peak. The full width at half maximum in such a case refers to the width of the entire PL spectrum at an intensity of 0.5.

The luminescent material with the emission spectrum having the first and second peaks may be a fluorescent luminescent material. The second luminescent material that has a small second peak or that can be regarded as having no second peak may be a phosphorescent luminescent material.

Specifically, the light emitting element including a fluorescent material may satisfy inequality (1) or (2) described above, and the second light emitting element including a phosphorescent material may satisfy neither one of inequalities (1) and (2) described above.

The luminous color of the second light emitting element may be green. The width of the PL spectrum of the second luminescent material may be narrower than those of the other light emitting elements. This is to avoid overlap with other colors, as green wavelengths are a range between blue and red.

For $\lambda_{off}$ of the light emitting apparatus according to the present exemplary embodiment, light at a radiation angle of 15° with respect to the main surface of the substrate 5 tends to be increased, $\lambda_{off}$ may be an interference peak resonance wavelength that reinforces light at a radiation angle of 15°.

To configure the light emitting apparatus according to the present exemplary embodiment, specifically, the interference peak resonance wavelength in the front direction that is determined based on materials and thickness of the organic layer 7 of the light emitting elements 3 is set to the longer wavelength side of the PL peak wavelength of the luminescent material. By setting it so, light near the PL peak wavelength with the highest intensity in the PL spectrum of the luminescent material is emitted toward the inclined part 13 of the light extraction structure 4. The inclined part 13 causes refraction in the front direction of the substrate 5, so that the luminance at the front direction improves. The configuration of the light emitting apparatus according to the present invention can be referred to as an optical interference condition specific to a light emitting element having a light extraction structure. The inclined part 13 of the light extraction structure 4 has an inclination angle of desirably 0° or more and less than 90°, more desirably 9° or more and 60° or less, with respect to the main surface of the substrate 5. By setting it within these ranges, the luminance in the front direction of the substrate improves.

To increase the optical interference condition is to adjust a distance do from a light emission position on the light emitting layer to a reflection surface of a light reflection material so that $d_0=m\lambda/4n_0$ (i=1, 3, 5, . . . ) is obtained, thus achieving constructive interference. This results in an increase in components of a specific direction in a radiation distribution of light with a wavelength λ, and the radiance at a specific angle improves.

In a case where an optical distance Lr from the emission position to the reflection surface of the light reflection layer reinforces the wavelength λ, Lr is expressed by the following equation (4):

$$Lr=(2m-(\varphi r/\pi))\times(\lambda/4)\times 1/\cos(\theta_{eml}). \tag{4}$$

In equation (4), m is an interference order from an emission point to the reflection layer 6 and is an integer greater than or equal to 0, and no is an effective refractive index of the layer from the emission position to the reflection surface at the wavelength λ. In an ideal case where Φr=π, a case where m=0 is referred to as a λ/4 interference condition, and a case where and m=1 is referred to as a 3λ/4 interference condition. Further, φr[rad] is the sum of phase shift amounts in a case where light with the wavelength λ is reflected on the reflection surface, and $\theta_{eml}$ is a radiation angle with respect to the normal direction of the substrate 5 in the light emitting layer. The optical distance Lr is the sum of the products of refractive indexes nj and thicknesses dj of the layers of the organic compound layer. In other words, Lr can also be expressed as $\Sigma n_j \times d_j$, or also as $n_0 \times d_0$. Further, φ is a negative value.

In a case where an interference L of all layers intensifies the wavelength λ, L is expressed by the following equation (5):

$$L=(Lr+Ls)=(2M-\Phi/\pi)\times(\lambda/4)\times 1/\cos(\theta_{eml}), \tag{5}$$

where Ls is an optical distance from the emission position to a reflection surface of a light extraction electrode, φs[rad] is the sum of phase shifts in a case where light with the wavelength λ is reflected at the reflection surface of the light extraction electrode, M is m+m', and m' is an interference order from the emission point to the light extraction electrode and is an integer greater than or equal to 0.

Here, M is the sum (M=m+m') of the interference order m between the emission point and the reflection layer 6 and the interference order m' between the emission point and the light extraction electrode and is an integer greater than or equal to 0. Further, Φ is the sum of phase shifts (Φ=φr+φs) in a case where light with the wavelength λ is reflected at the light reflection layer 6 and the light extraction electrode. Equation (5) expresses the interference that is referred to as the interference of all layers of the organic compound layer.

For the organic light emitting element without an inclined surface of the light extraction structure 4, the thickness and the like of the organic layer 7 is designed to satisfy equations (4) and (5) under the condition that the front direction, specifically $\theta_{eml}=0°$ direction.

The interference peak resonance wavelength $\lambda_{on}$ (on-axis) in the front direction at that time is expressed by the following equation (6):

$$\lambda_{on}=4\pi L/(2\pi M-\Phi). \tag{6}$$

For the organic light emitting element without an inclined surface of the light extraction structure 4, thicknesses and materials are designed so that the peak resonance wavelength $\lambda_{on}$ in the front direction that is expressed by the foregoing equation (6) substantially matches the peak wavelength $\lambda_{PL}$ of the PL spectrum of the light emitting dopant.

In a case where the light extraction structures 4 are included, in other words, a case according to an exemplary embodiment of the present invention, the radiation angle of radiation in the front direction in the organic light emitting element changes depending on a pixel emission position in a pixel light emitting region.

FIGS. 2A and 2B are diagrams illustrating how the radiated light 12 radiated from one emission point 11 above the reflection layer 6 is refracted at an inclined part 13 of a microlens 10 and exits in the normal direction of the substrate 5. While the microlenses 10 are illustrated as an example of the light extraction structures 4, the determination is based on the relationship between an inclination angle and the emission position, irrespective of the shape of the light extraction structures 4. In FIG. 2A, no is a refractive index of the outside of the element 3, $n_1$ is a refractive index of the microlenses 10, $n_2$ is a refractive index of the protection layer 9, $n_{eml}$ is a refractive index of the organic layer 7, and the relationship $n_0<n_1$ is satisfied. For simplification, $n_2=n_{eml}$ is set. In FIG. 2B, $n_3$ is a refractive index of a filling layer that fills the space between the microlenses 10 and the protection layer 9, and the relationship $n_3<n_1$ is satisfied. While details are not illustrated in FIGS. 2A and 2B, the organic layer 7 and the protection layer 9 may each have a layered structure, and in this case, each refractive index may be a thickness-weighted average value $\Sigma n_j \times d_j/\Sigma d_j$.

A distance X between the emission point 11 of radiation of the radiated light 12 to be refracted at the inclined part 13 in the front direction and a pixel center is expressed by equation (7) below. The radiation angle $\theta_{eml}$ of radiated light 41 in the light emitting layer is expressed by equation (8) below:

$$X(\phi)=R(\phi)-r(\phi)=R(\phi)-\Sigma_i d_i\ \tan\left[\sin^{-1}\left(\frac{n_{eml}}{n_i}\ \sin(\theta_{eml}\ (\psi))\right)\right] \tag{7}$$

$$\theta_{eml}(\phi)=\sin^{-1}\left[\frac{n_i}{n_{eml}}\sin\left\{\phi-\sin^{-1}\left(\frac{n_o}{n_{eml}}\sin\psi\right)\right\}\right], \tag{8}$$

where R is a distance between the inclined part 13 of the microlens 10 that has an inclination angle ψ with respect to the main surface of the substrate 5 and the pixel center in a direction parallel to the main surface of the substrate 5, and r is a distance between the inclined part 13 and the emission point 11 in the direction parallel to the main surface of the substrate 5. The pixel center may be a midpoint of the lower electrode in a cross section perpendicular to the main surface of the substrate. Alternatively, in a case where there is an insulation layer at an end portion of the lower electrode, the pixel center may be a midpoint of an opening of the insulation layer on the lower electrode in the cross section perpendicular to the main surface of the substrate.

Further, di and $n_i$ are a thickness and a refractive index of the i-th layer, respectively. Here, R(ψ) is a structure parameter indicating the relationship between the position of the light extraction structure 4 and the inclination angle, and for the spherical microlenses illustrated as an example in FIG. 2A, R=A*sin ψ, where A is a radius of curvature of the microlenses. Both X and $\theta_{eml}$ are functions of the inclination angle ψ of the inclined part 13 of the light extraction structure 4. Specifically, a pixel light emitting region that contributes to the radiance in the front direction is determined for each inclination angle of the inclined part 13 of the light extraction structure 4, and the radiation angle of light that is radiated from the light emitting region and refracted at the inclined surface in the front direction in the light emitting layer is determined. In other words, for the organic light emitting element including the light extraction structure 4, the interference condition is to be optimized in correspondence to the inclination angle of the inclined part 13 of the light extraction structure 4 with the highest contribution rate. Specifically, the difference between the interference peak resonance wavelength in the radiation angle $\theta_{eml}$ direction corresponding to the inclination angle with the highest contribution rate and the PL peak wavelength is reduced.

Next, an inclined part with the highest contribution rate will be defined, and the interference peak resonance wavelength in the radiation angle $\theta_{eml}$ direction corresponding to the inclination angle with the highest contribution rate will be described below. The inclined part with the highest contribution rate refers to an inclined part of a light extraction structure that has a maximum light-emitting area in a pixel light emission range in which light to be refracted at the inclined part in the front direction is emittable.

Figure 3A:
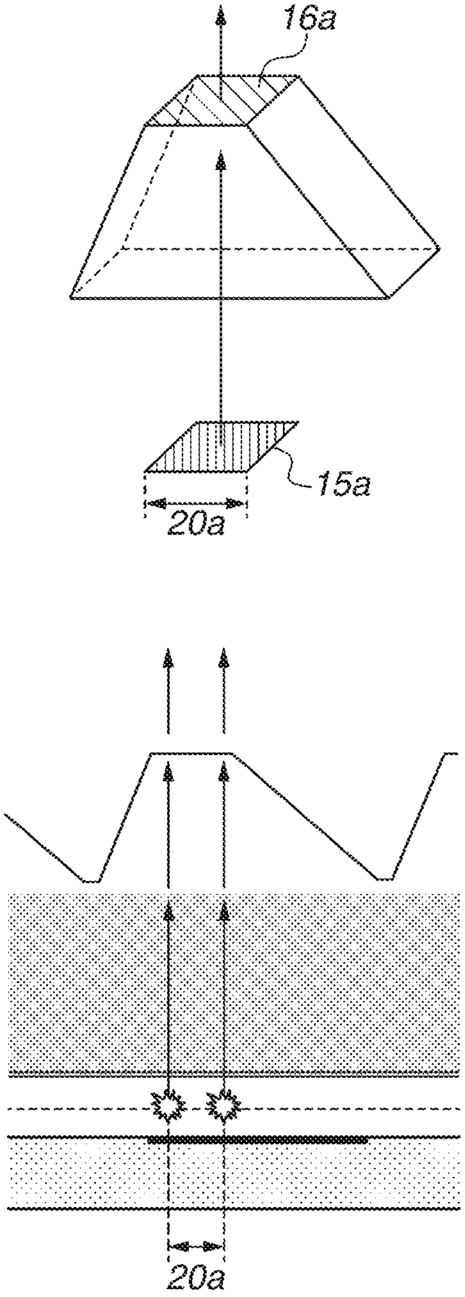
FIG. 3A is a schematic diagram illustrating light emitted from an emission point in a front direction of a light emitting apparatus.
Figure 3B:
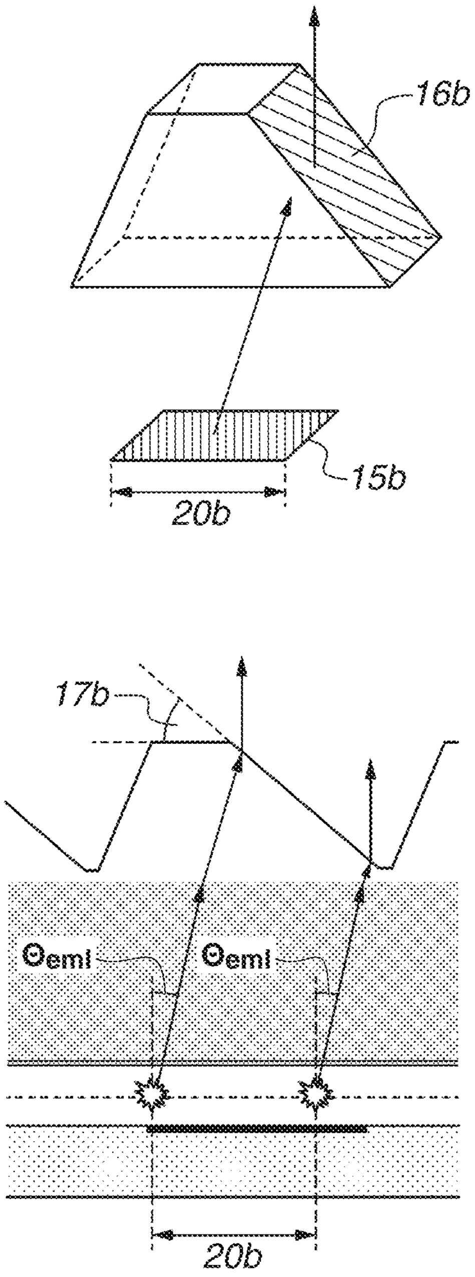
FIG. 3B is a schematic diagram illustrating light emitted from an emission point in a direction that is inclined with respect to a main surface of a substrate.

FIGS. 3A and 3B are diagrams illustrating how a light extraction structure according to the present exemplary embodiment extracts light in a front direction of a light emitting apparatus. FIG. 3A is a schematic diagram illustrating light emitted from emission points in the front direction of the light emitting apparatus. FIG. 3B is a schematic diagram illustrating light emitted from emission points in a direction that is inclined with respect to a main surface of a substrate. FIG. 3A is a stereoscopic view illustrating a relationship between a light-emitting area 15*a* and a light extraction surface 16*a*, and a cross-sectional view perpendicular to the main surface of the substrate including a pixel center is illustrated in a lower part of FIG. 3A. FIG. 3A illustrates the light extraction surface 16*a* (inclination angle 0°) from which light is emitted in a substrate main surface front direction with optical interference in a front direction of an organic light emitting element, the light-emitting area 15*a* corresponding to the light extraction surface 16*a*, and a light emitting region 20*a* from which light that exits in the front direction in the cross section is emitted. FIG. 3B illustrates a light-emitting area 15*b* configured to emit light to be refracted at a trapezoidal inclined part 16*b* (inclination angle 17*b*) in the front direction and a light emitting region 20*b* configured to emit light to be refracted in the front direction in the cross section. For the trapezoidal light extraction structures in FIGS. 3A and 3B, the light-emitting area is a maximum area. While the light extraction structures according to the present exemplary embodiment each have an inclined part, the shape is not limited, and any shape that can refract, in the front direction of the substrate, light emitted in a direction that is inclined with respect to the main surface of the substrate can be used.

The radiation angle $\theta_{eml}$ direction corresponding to the inclined part with the highest contribution rate here refers to a radiation angle at an emission point from which light that is emitted from the maximum light-emitting area and refracted at the inclined part with the highest contribution rate in the front direction.

In FIG. 3B, $\Theta_{eml}$ is a radiation angle of light that is emitted from the maximum pixel area 16*a* and refracted in the front direction through the inclined part 16*b*. An interference peak resonance wavelength $\lambda_{off}$ (off-axis) in the $\Theta_{eml}$ direction with respect to the main surface of the substrate is expressed by the following equation (9):

$$\lambda_{off} = 4\pi L/(2\pi M - \Phi) \times 1/\cos(\Theta_{eml}). \quad (9)$$

$\lambda_{off}$ will also be described as an interference peak resonance wavelength in an oblique direction.

Desirably, the optical interference condition of the organic light emitting element is determined so that the difference between the interference peak resonance wavelength $\lambda_{off}$ defined using equation (9) and the PL peak wavelength $\lambda_{PL}$ of the luminescent material is less than the difference between the interference peak wavelength $\lambda_{on}$ in the front direction that is defined using equation (6) and $\lambda_{PL}$. As described below with reference to examples, $\lambda_{off}$ may substantially correspond to the peak wavelength $\lambda_{EL}$ of the EL spectrum of the light emitting apparatus according to the present exemplary embodiment. Specifically, the optical interference condition of the organic light emitting element may be determined so that the difference between $\lambda_{EL}$ and $\lambda_{PL}$ becomes less than the difference between the interference peak wavelength $\lambda_{on}$ in the front direction and $\lambda_{PL}$.

Figure 4A:
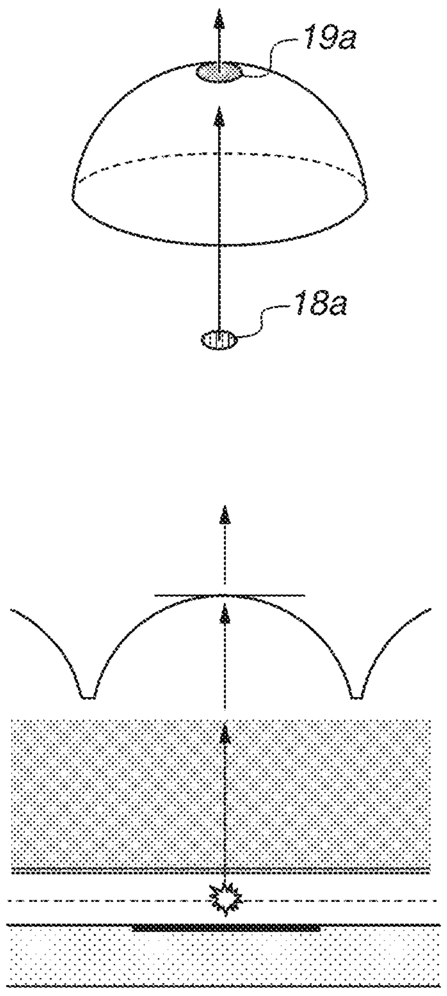
FIG. 4A is a schematic diagram illustrating a method of estimating $\Theta_{eml}$ in a case where spherical microlenses are used as an example of a light extraction structure.
Figure 4B:
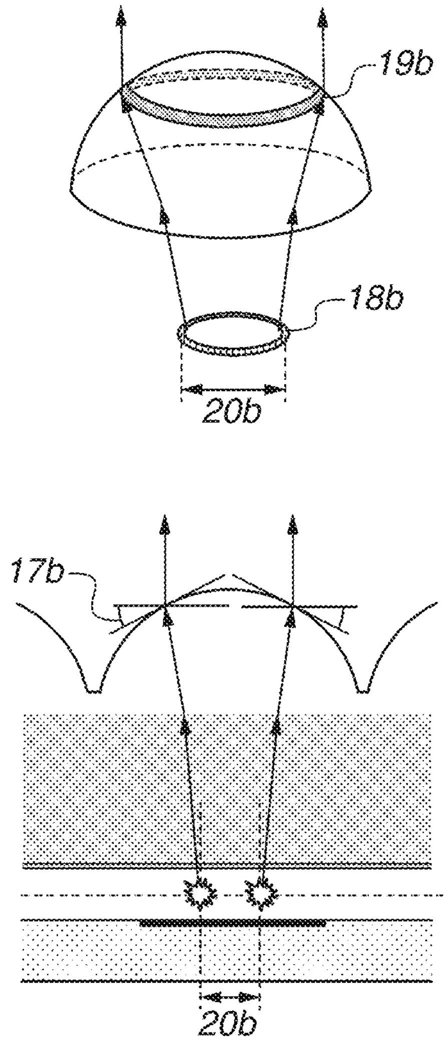
FIG. 4B is a schematic diagram illustrating a method of estimating $\Theta_{eml}$ in a case where spherical microlenses are used as an example of a light extraction structure.
Figure 4C:
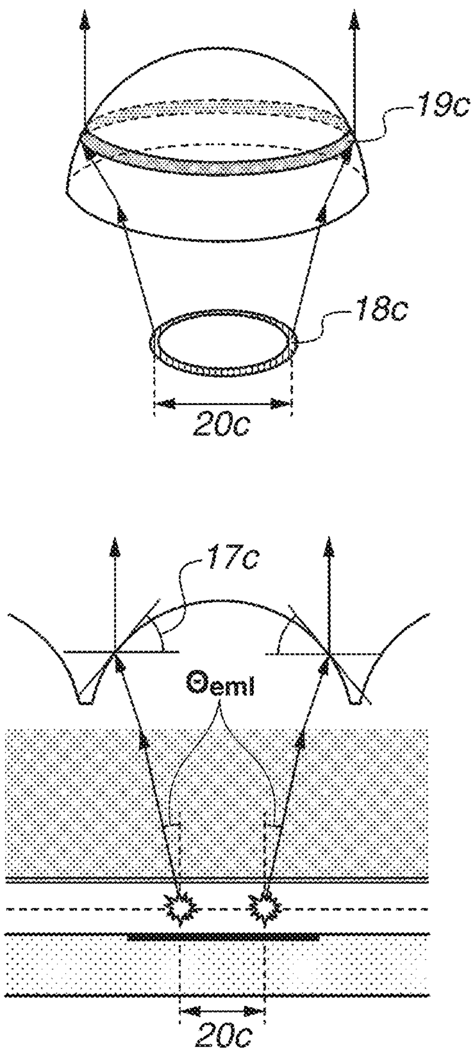
FIG. 4C is a schematic diagram illustrating a method of estimating $\Theta_{eml}$ in a case where spherical microlenses are used as an example of a light extraction structure.
Figure 4D:
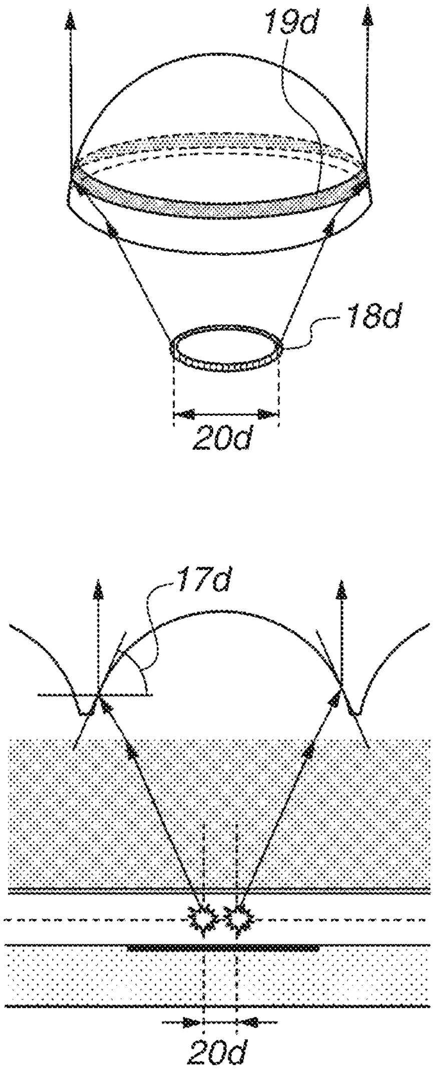
FIG. 4D is a schematic diagram illustrating a method of estimating $\Theta_{eml}$ in a case where spherical microlenses are used as an example of a light extraction structure.

FIGS. 4A to 4D are schematic diagrams illustrating a desirable method for estimating the radiation angle $\Theta_{eml}$ in a case where spherical microlenses are used as an example of a light extraction structure. FIGS. 4A to 4D differ in emission angle with respect to a main surface of a substrate. In upper parts in FIGS. 4A to 4D, stereoscopic views illustrating relationships between light-emitting areas 18*a* to 18*d* and a light extraction surface 19*a* and inclined parts 19*b* to 19*d* are illustrated, and in lower parts in FIGS. 4A to 4D, cross-sectional views that are perpendicular to the main surface of the substrate and include pixel centers are illustrated. The light extraction surface 19*a* is referred to as a light extraction surface because it is not inclined. While the parts 19*b* to 19*d* are referred to as inclined parts because they are inclined, the parts 19*b* to 19*d* may also be referred to as light extraction surfaces. For microlenses as illustrated in FIGS. 4A to 4D, an inclined part with the highest contribution rate is an inclined part of a light extraction structure having a maximum light-emitting area in a pixel light emission range in which light to be refracted at the inclined part in the front direction is emittable. Specifically, for spherical microlenses, a position at which the light-emitting area is maximized corresponds to an outermost region. FIG. 4C illustrates how light that is emitted from a maximum light-emitting area 18*c* of a light emitting region in which light can be refracted at inclined surfaces of spherical microlenses in the front direction is refracted at inclined parts 19$c$ in the front direction. For microlenses, it is sufficient for the $\Theta_{eml}$ direction to be set to a radiation angle at a light emitting layer from the outermost region 18$c$ toward the inclined part 19$c$ as illustrated in FIG. 4C. According to a ray tracking simulation, the radiation angle $\Theta_{eml}$ is desirably greater than 0° and less than 30°, more desirably 5° or greater and 20° or less.

Next, an effect of reducing the difference between the interference peak resonance wavelength $\lambda_{off}$ in the oblique direction that is defined using equation (9) and the PL peak wavelength $\lambda_{PL}$ of the luminescent material to be less than the difference between the interference peak wavelength $\lambda_{on}$ in the front direction that is defined by using equation (6) and $\lambda_{PL}$ will be described below.

Figure 5A:
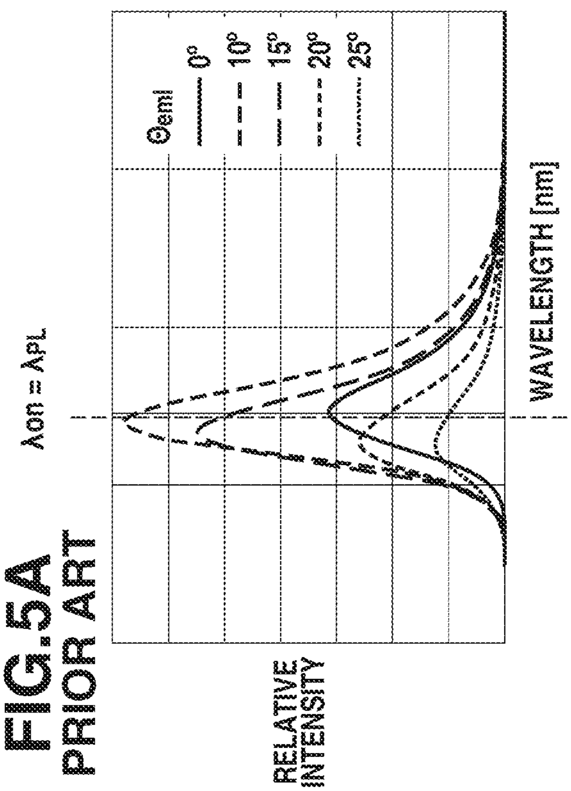
FIG.5A PRIOR ART
FIG. 5A is a graph illustrating $\lambda_{off}$ and $\lambda_{on}$ of a photoluminescence (PL) spectrum and an interference spectrum of a luminescent material according to a comparative example.
Figure 5B:
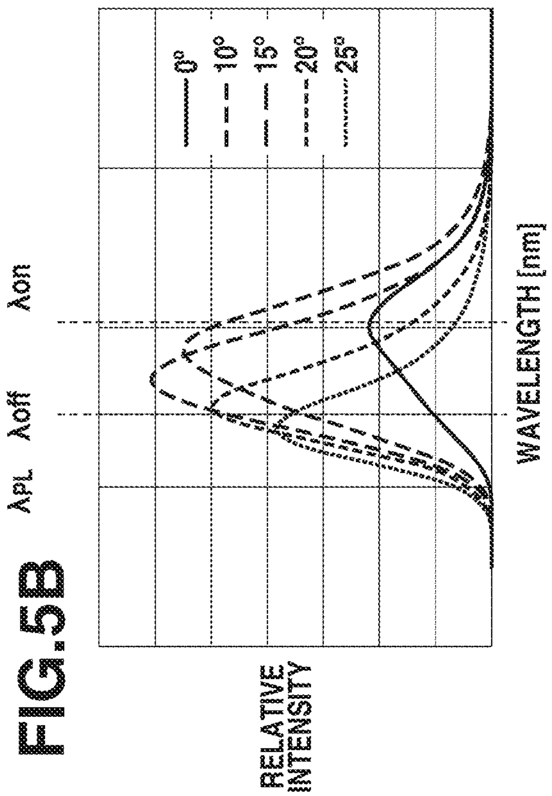
FIG. 5B is a graph illustrating $\lambda_{off}$ and $\lambda_{on}$ of a PL spectrum and an interference spectrum of a luminescent material in a light emitting element that intensifies light emitted in a direction that is inclined with respect to a main surface of a substrate.
Figure 5C:
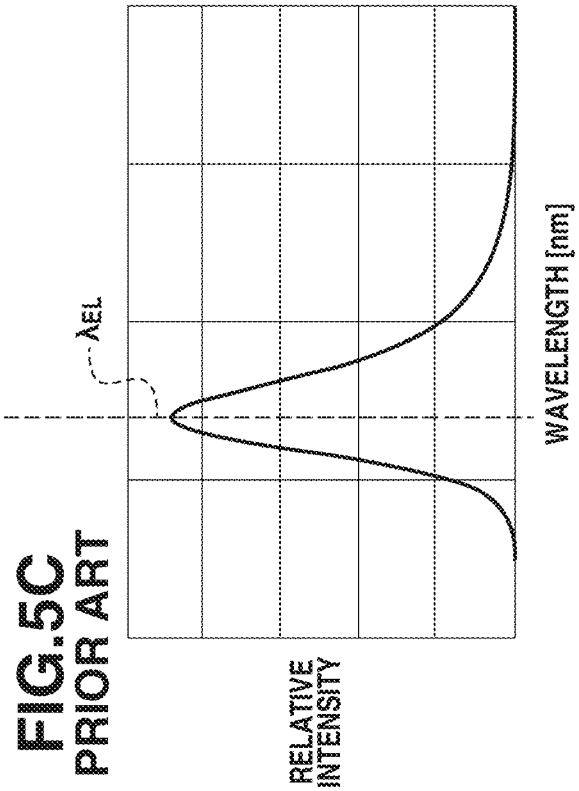
FIG.5C PRIOR ART
FIG. 5C illustrates an electroluminescent (EL) spectrum corresponding to FIG. 5A.
Figure 5D:
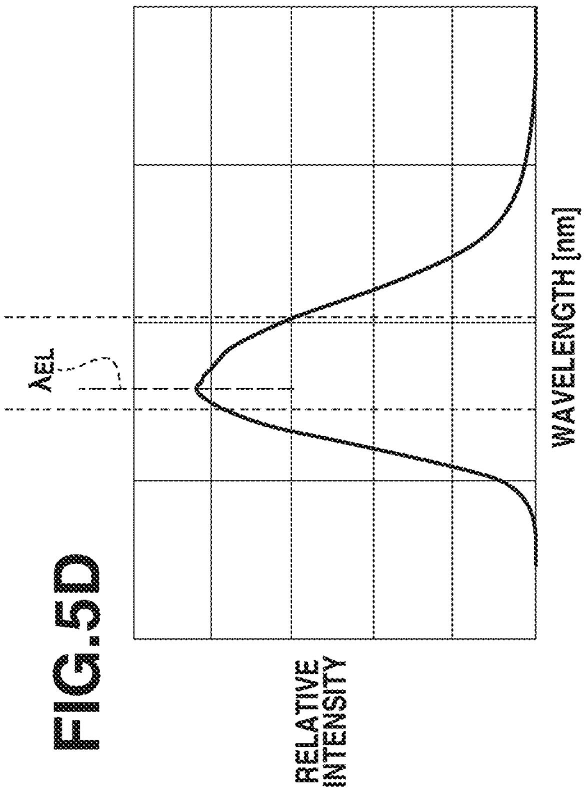
FIG. 5D illustrates an EL spectrum corresponding to FIG. 5B.

FIGS. 5A to 5D are graphs illustrating a PL spectrum of a luminescent material, an interference spectrum that intensifies the front direction, and an interference spectrum that intensifies the inclined direction. FIG. 5A illustrates a relationship between $\lambda_{off}$, $\lambda_{on}$, and $\lambda_{PL}$ of a light emitting element that is a conventional example and has a configuration to intensify light emitted in a front direction of a main surface of a substrate. FIG. 5B illustrates a light emitting element that has a configuration according to the present invention and intensifies light emitted in a direction that is inclined with respect to a main surface of a substrate. The configuration in FIG. 5B illustrates a case where the difference between the interference peak resonance wavelength $\lambda_{off}$ in the direction that is inclined with respect to the main surface of the substrate and the PL peak wavelength $\lambda_{PL}$ of the luminescent material is less than the difference between $\lambda_{PL}$ and the interference peak $\lambda_{on}$ in the front direction of the main surface of the substrate. FIG. 5C illustrates a spectrum in the front direction through microlenses of the light emitting element corresponding to the configuration in FIG. 5A. FIG. 5D illustrates a spectrum in the front direction through microlenses of the light emitting element corresponding to the configuration in FIG. 5B. FIGS. 5A and 5B are diagrams illustrating the spectra obtained by decomposing the spectra in FIGS. 5C and 5D, respectively, by radiation angle components in the light emitting layer.

In FIGS. 5A to 5D, microlenses as illustrated in FIGS. 4A to 4D are intended, and it is assumed that $\Theta_{eml}$ is roughly about 15°. It is to be noted that this effect is independent of the $\Theta_{eml}$ value.

In FIGS. 5A and 5B, $\theta_{eml}$=0° corresponds to the emission intensity of the light emitting element in a case where the configuration of the light emitting element includes no light extraction structure. As described above, in a case where an organic light emitting element has no light extraction structure, the interference peak wavelength $\lambda_{on}$ in the front direction and $\lambda_{PL}$ are matched. This is also indicated by the radiance at $\theta_{eml}$=0° in FIG. 5A being greater than the radiance at $\theta_{eml}$=0° in FIG. 5B. In a case where a microlens is included, the contribution rate of $\Theta_{eml}$ to the radiance in the front direction changes. Specifically, light that refracts in the front direction varies depending on the angle.

With the conventional configuration illustrated in FIG. 5A, the interference peak resonance wavelength $\lambda_{off}$ with the highest efficiency of extraction in the front direction by the light extraction structure (hereinafter, the efficiency will be referred to as "front extraction efficiency") is located on the shorter wavelength side of the PL spectrum $\lambda_{PL}$. The PL spectrum decreases sharply on the shorter wavelength side of the PL peak. Specifically, the intensity decreases significantly. Consequently, the spectrum area (radiance) on the shorter wavelength side of the PL peak wavelength decreases. Thus, although the effect of reinforcement of $\lambda_{off}$ is significant in the wavelength region of $\lambda_{off}$ in FIG. 5A, the quantity of light emitted from the luminescent material is small, so that an increase in front light extraction efficiency produced by the light extraction structure is small. This is also indicated by the small emission intensities at $\theta_{eml}$=15°, 25° in FIG. 5A.

In contrast to this, in a case where the difference between the interference peak resonance wavelength $\lambda_{off}$ in the direction that is inclined with respect to the main surface of the substrate and the PL peak wavelength $\lambda_{PL}$ is less than the difference between the interference peak wavelength $\lambda_{on}$ in the front direction of the main surface of the substrate and $\lambda_{PL}$, a region where the front light extraction efficiency of the light extraction structure is high and a region where the emission intensity of the PL spectrum is high overlap with each other. Specifically, the radiances at $\theta_{eml}$=15°, 25° in FIG. 5B can be increased. Since the spectrum area in FIG. 5D is greater than the spectrum area in FIG. 5C, the light emitting element in FIG. 5D is greater in radiance of the organic light emitting element including the light extraction structure. In other words, the radiance in the front direction becomes high in a case where the difference between the interference peak resonance wavelength $\lambda_{off}$ in the direction that is inclined with respect to the main surface of the substrate and the PL peak wavelength $\lambda_{PL}$ is less than the difference between $\lambda_{PL}$ and the interference peak wavelength $\lambda_{on}$ in the front direction of the main surface of the substrate.

With the present invention, since the interference peak wavelength $\lambda_{on}$ in the front direction of the main surface of the substrate of the organic light emitting element including the light extraction structure is set on the longer wavelength side of the PL peak wavelength $\lambda_{PL}$ of the luminescent material, the radiance in the front direction is high. Specifically, the difference between the interference peak resonance wavelength $\lambda_{off}$ in the direction that is inclined with respect to the main surface of the substrate and the PL peak wavelength $\lambda_{PL}$ is reduced to be less than the difference between $\lambda_{PL}$ and the interference peak wavelength $\lambda_{on}$ in the front direction, so that the radiance in the front direction increases dramatically. As illustrated in FIGS. 5B and 5D, the interference peak resonance wavelength $\lambda_{off}$ in the direction that is inclined with respect to the main surface of the substrate and the peak wavelength $\lambda_{EL}$ of the EL spectrum nearly match.

In order to increase the radiance in the front direction of the main surface of the substrate, $\lambda_{off}$ and $\lambda_{PL}$ may be matched. In a case where the spectrum of the luminescent material has a second peak $\lambda_{PL2}$ that is lower in intensity than $\lambda_{PL}$, $\lambda_{PL2}$ may be matched with $\lambda_{on}$. Specifically, $\lambda_{PL}$ is close in the interference spectrum in the direction that is inclined with respect to the main surface of the substrate, and $\lambda_{PL2}$ is close in the interference spectrum in the front direction of the main surface of the substrate. In comparing them, $\lambda_{PL}$ and $\lambda_{off}$ may be closer than $\lambda_{PL2}$ and $\lambda_{on}$.

Figure 6A:
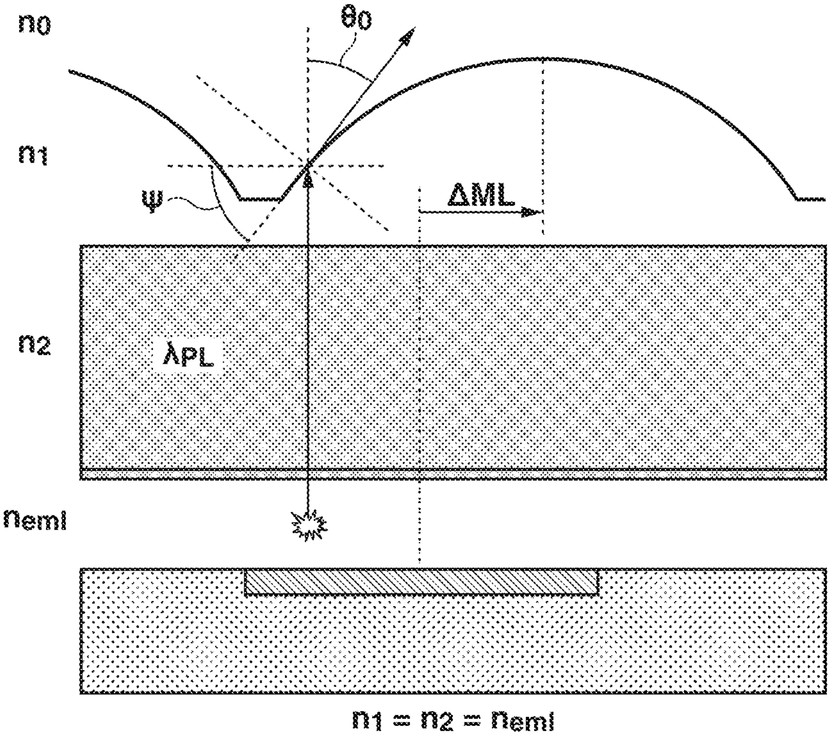
FIG.6A PRIOR ART
FIG. 6A is a schematic diagram illustrating emitted light refracted at a microlens in a conventional configuration in which the microlens is shifted and an interference peak resonance wavelength $\lambda_{on}$ in a front direction of a main surface of a substrate and $\lambda_{PL}$ are matched.
Figure 6B:
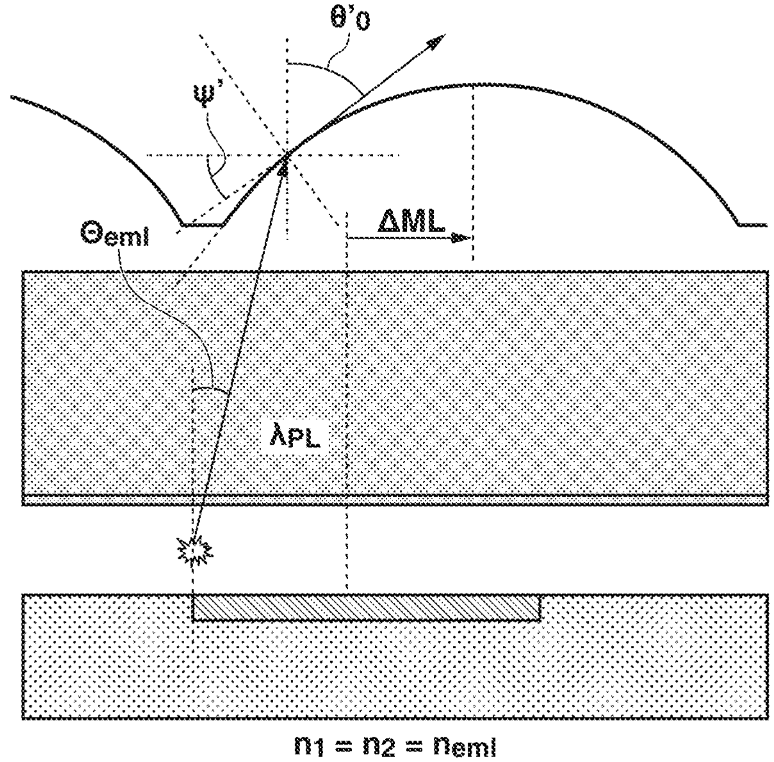
FIG. 6B is a schematic diagram illustrating emitted light refracted at a microlens in a configuration in which an interference peak resonance wavelength $\lambda_{off}$ in a direction that is inclined with respect to a main surface of a substrate and $\lambda_{PL}$ are matched.

FIGS. 6A and 6B are schematic diagrams illustrating emitted light refracted by a microlens in a case where the microlens is shifted. Since the configuration brings the interference peak resonance wavelength $\lambda_{off}$ in the direction that is inclined with respect to the main surface of the substrate close to the PL peak wavelength $\lambda_{PL}$, microlens shift enables light with the PL peak wavelength to be refracted toward the wide-angle side. The "microlens shift" (hereinafter, "ΔML") indicates that a distance is provided between a center position of the microlens and a center position of a pixel opening in a direction parallel to the main surface of the substrate. The center of the microlens can be estimated based on a midpoint of the microlens in the cross section perpendicular to the main surface of the substrate. The center of the pixel opening can be estimated based on a midpoint of the lower electrode in the cross section perpendicular to the main surface of the substrate. Further, in a case where an end portion of the lower electrode is covered with a pixel separation layer, the center of the pixel opening can be estimated based on a midpoint of a line segment from a pixel separation layer to another pixel separation layer in the cross-sectional view. The cross-sectional views may be selected to pass through a vertex of the microlens.

The light emitting apparatus according to the present exemplary embodiment may include a second light emitting element different from the light emitting element and a second light extraction structure where light from the second light emitting element enters, the second light extraction structure being different from the light extraction structure, and a distance between a midpoint of a light emitting region of the light emitting element in a cross section perpendicular to the main surface of the substrate and a midpoint of the light extraction structure in a direction parallel to the main surface of the substrate may be greater than a distance between a midpoint of a light emitting region of the second light emitting element in the cross section perpendicular to the main surface of the substrate and a midpoint of the second light extraction structure in the direction parallel to the main surface of the substrate.

A third light emitting element different from the second light emitting element and a third light extraction structure where light from the third light emitting element enters, the third light extraction structure being different from the second light extraction structure may further be included, and the distance between the midpoint of the light emitting region of the second light emitting element in the cross section perpendicular to the main surface of the substrate and the midpoint of the second light extraction structure in the direction parallel to the main surface of the substrate may be greater than a distance between a midpoint of a light emitting region of the third light emitting element in the cross section perpendicular to the main surface of the substrate and a midpoint of the third light extraction structure in the direction parallel to the main surface of the substrate.

FIG. 6A illustrates a conventional configuration in which an interference peak resonance wavelength $\lambda_{on}$ in the front direction of the main surface of the substrate and $\lambda_{PL}$ are matched. FIG. 6B illustrates a configuration in which the interference peak resonance wavelength $\lambda_{off}$ in the direction that is inclined with respect to the main surface of the substrate and $\lambda_{PL}$ are matched. Light with the PL peak wavelength $\lambda_{PL}$ is radiated toward the wider angle side in the configuration illustrated in FIG. 6B as a result of the microlens shift than in the configuration illustrated in FIG. 6A. This is because interference that intensifies light in the direction that is inclined with respect to the main surface of the substrate is configured in FIG. 6B. For simplification, a case where $n_1=n_2=n_{eml}$ and $n_0<n_1$ is illustrated herein. The same result that light with $\lambda_{PL}$ is emitted toward the wider angle side in FIG. 6B than in FIG. 6A is obtained even in a case where refraction occurs at each interface.

In FIGS. 6A and 6B, light is emitted from the light emitting region is refracted at an angle $\theta_0$ ($\theta'_0$ in FIG. 6B) by an inclined part of the microlens. The condition in FIG. 6A satisfies the following equation (10):

$$n_0 \times \sin(\theta_0 + \psi) = n_{eml} \times \sin(\theta_{eml} + \psi), \tag{10}$$

where $\psi$ ($\psi'$ in FIG. 6B) is an inclination angle of the microlens.

In equation (10), $\theta_{eml}$ is a radiation angle at an emission point. In FIG. 6A where $\lambda_{on}=\lambda_{PL}$, $\theta_{eml}=0°$, whereas in FIG. 6B where $\lambda_{off}=\lambda_{PL}$, $\theta_{eml}=\Theta_{eml}$. It is evident from FIGS. 6A and 6B and equation (10) that in the light emitting apparatus according to the present exemplary embodiment, light with $\lambda_{PL}$ is incident on the inclined part in the oblique direction as illustrated in FIG. 6B, thus refracting the light with $\lambda_{PL}$ toward the wider angle side. A maximum value of the refraction angle that are derived from the total reflection condition in equation (10) for the case where $\lambda_{on}=\lambda_{PL}$ and the case where $\lambda_{off}=\lambda_{PL}$ are respectively expressed by the following equations (11) and (12):

$$\theta_0 = \pi/2 - \sin^{-1}(n_0/n_{eml}), \text{ and} \tag{11}$$

$$\theta'_0 = \pi/2 + \Theta_{eml} - \sin^{-1}(n_0/n_{eml}) = \theta_0 + \Theta_{eml}. \tag{12}$$

Specifically, the optical interference condition for the organic light emitting element that the interference peak resonance wavelength $\lambda_{off}$ in the direction that is inclined with respect to the main surface of the substrate is brought closer to the PL peak wavelength $\lambda_{PL}$ is satisfied so that the refraction direction is shifted toward the wider angle side by $\Theta_{eml}$, as compared with the conventional configuration. In other words, the configuration according to the present exemplary embodiment makes it possible to widen an angle adjustment range with a microlens shift, as compared with the conventional configuration. Once radiation toward the wider angle side becomes possible, application to an optical system with a shorter focal length becomes possible with a small display apparatus while increasing the field of view (FOV). Specifically, it becomes possible to reduce the size of a head-mounted display.

In at least some region of the light emitting apparatus, the distance between the position of the center of the light extraction structure and the position of the center of the pixel opening in an inward direction of the substrate surface may be adjusted as appropriate.

Figure 7A:
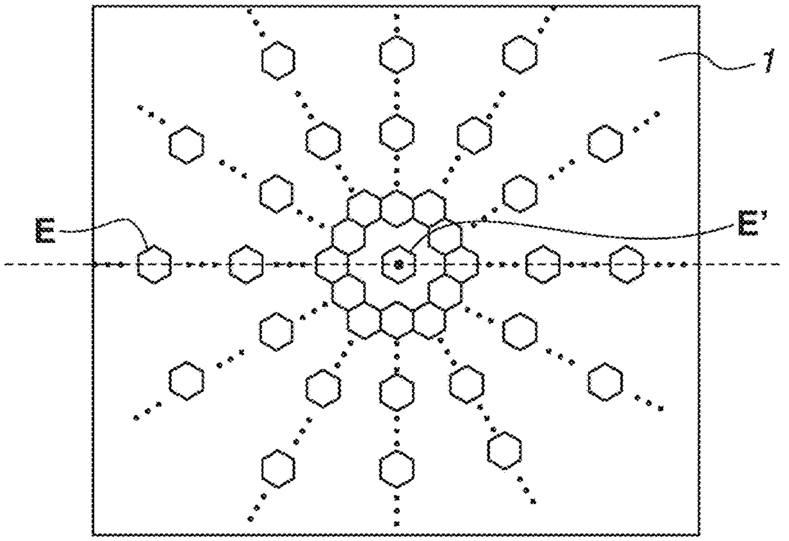
FIG. 7A is a plan view illustrating a display region where the relative positions of microlenses and pixels differ at different positions in the display region.
Figure 7B:
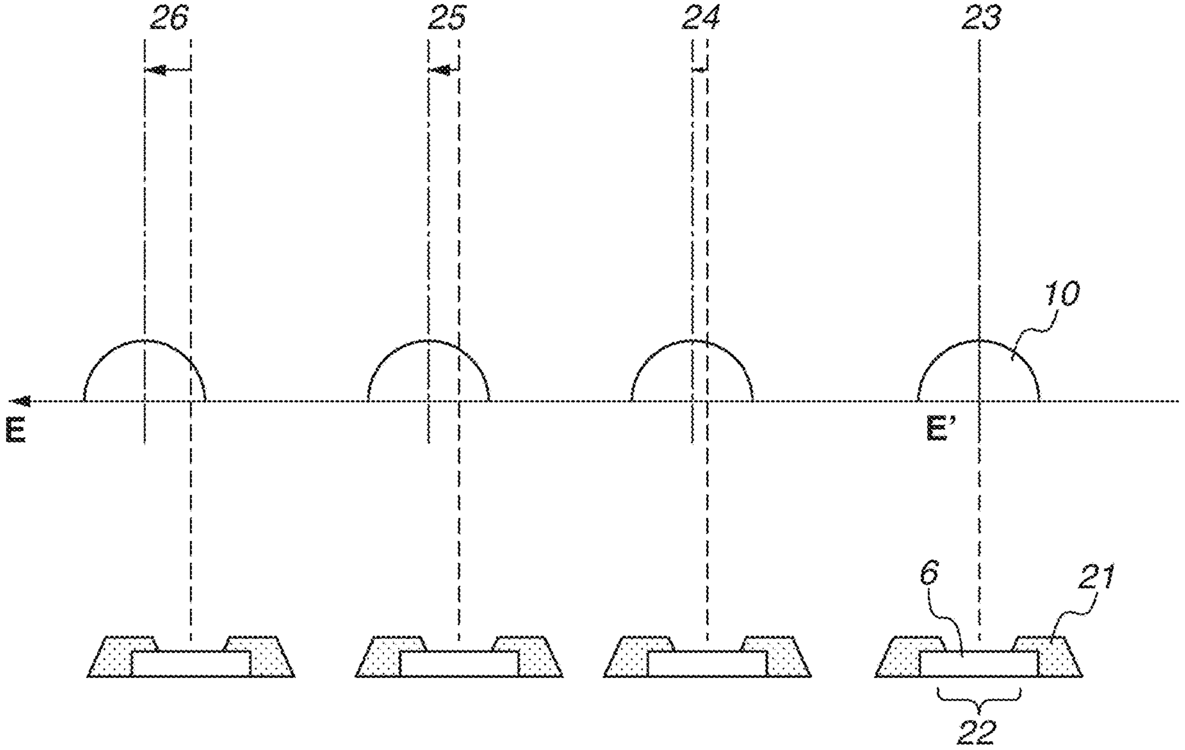
FIG. 7B is a schematic diagram illustrating a cross section taken along the line E-E' in FIG. 7A.

FIGS. 7A and 7B are plan views illustrating that the relative position of a microlens and the corresponding pixel differs depending on their positions in a display region 1. FIG. 7A is a plan view illustrating the display region 1. FIG. 7B is a schematic diagram illustrating a cross section along E-E' specified in FIG. 7A. FIG. 7B illustrates a relationship between the relative position of the center of a microlens 10 and the center of the corresponding light emitting region 22 and the positions of light emitting elements in the display region 1. At the position of the center of the display region 1, the center of the microlens 10 matches the center of the light emitting region 22. In other words, a ΔML23 is 0. The closer the microlens 10 and the light emitting region 22 to the left in FIG. 7B, the greater the distance between the center of the microlens 10 and the center of the light emitting region 22. Specifically, a ΔML24 is greater than a ΔML23, and a ΔML25 is greater than a ΔML24. In FIG. 7B, a ΔML26 is the greatest distance between the center of the microlens 10 and the center of the light emitting region 22. The distances between the centers of the microlenses 10 and the centers of the light emitting regions 22 in FIG. 7B are mere examples, and a ΔML may increase from the center toward end portions of the display region 1 as illustrated in FIG. 7B, or a ΔML may decrease from the center toward end portions of the display region 1. Further, ΔMLs may be provided to change continuously with respect to the position of the display region 1 from a macroscopic perspective. It is only sufficient for the ΔMLs to continuously change from a macroscopic perspective, and the ΔMLs may be changed for each light emitting element or may be changed gradually for each set of a plurality of light emitting elements. Alternatively, the form of changing the ΔML for each light emitting element and the form of changing the ΔML gradually for each set of a plurality of light emitting elements may be used in combination. While the ΔML23 at the center of the display region 1 is set to zero according to the present exemplary embodiment, the ΔML23 does not have to be zero. Further, the ΔMLs in the display region 1 may be constant.

Other Exemplary Embodiments

Figure 8A:
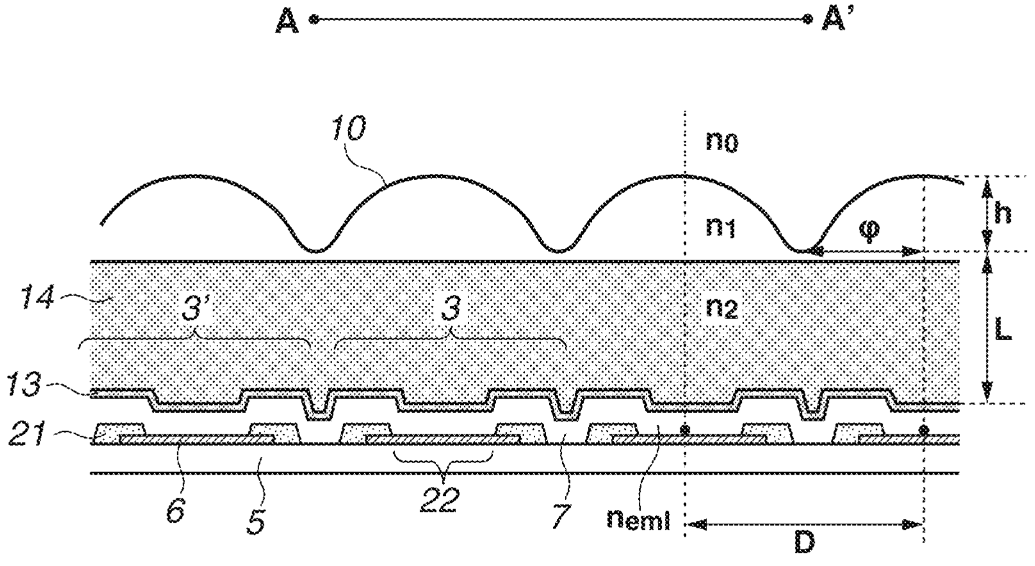
FIG. 8A is a diagram illustrating an example of another configuration of a light emitting apparatus according to an exemplary embodiment of the present invention.

FIGS. 8A to 8D are diagrams illustrating other examples of configurations of the light emitting apparatus according to an exemplary embodiment of the present invention. FIG. 8A is a schematic diagram illustrating a cross section of the light emitting apparatus according to an exemplary embodiment of the present invention. In the present exemplary embodiment, an example of a light extraction structure is a microlens. It is sufficient for the light extraction structure to have an inclination angle with respect to a main surface of an insulation layer and may be an aspherical microlens, a conical microlens, a cylindrical microlens, or a digital microlens, other than the microlens.

FIG. 8A illustrates a light emitting apparatus in which each light emitting element 3 on the substrate 5 includes the reflection layer 6, pixel separation layers 21 covering end portions of the reflection layer 6, the organic layer 7 including the luminescent material, the semi-transparent electrode 8, the protection layer 9, and the microlens 10. The portion of the reflection layer 6 that is not covered with the pixel separation layers 21 is the light emitting region 22. The portion of the reflection layer 6 that is not covered with the pixel separation layers 21 is also referred to as a pixel opening. The pixel separation layers 21 have a bank structure and are insulation layers. The reflection layer 6 and the semi-transparent electrode 8 are also referred to as a lower electrode and an upper electrode, respectively, because of their placement positions. A dummy pixel 3' is disposed outside of the display region 1 to maintain characteristics of the outermost light emitting element 3. A plurality of rows and columns of the dummy pixels 3' may be formed. Components of the dummy pixels 3' may be the same as those of the light emitting elements 3. The dummy pixels 3' may have the same configuration as that of the light emitting elements 3, except that no current is supplied to the dummy pixels 3'.

An insulation layer (not illustrated) may be provided on the substrate 5. The insulation layer may be formed with an oxide layer, a nitride layer, or an organic layer. Due to its function, the insulation layer is also referred to as a planarization layer. For example, the insulation layer may have the role of reducing the effects of surface roughness of transistors formed on the substrate on the electrodes.

The organic layer 7 may include a plurality of layers. The plurality of layers includes a light emitting layer, and the light emitting layer includes a luminescent material. A light emitting layer that emits light of a single luminous color may be formed on the light emitting elements 3 and entire surfaces between the light emitting elements 3. To enable the display apparatus to display at least two or more colors, light emitting layers that emit a different color from each other may be stacked on the light emitting elements 3 and entire surfaces between the light emitting elements 3. Alternatively, light emitting layers that emit a different color from each other may be patterned on different light emitting elements 3. In a case where the organic layer 7 is formed with a light emitting layer that emits white light, a color filter may be provided between the light emitting elements 3 and the microlenses 10.

The protection layer 9 protects the light emitting element 3 and may be formed of an inorganic layer, such as a silicon nitride layer, a silicon oxynitride layer, a silicon oxide layer, or an aluminum oxide layer, and/or an organic layer, such as an acrylic resin layer, an epoxy resin layer, or a polyimide resin layer.

Light emitted from the light emitting element 3 is incident on the microlens 10. A planarization layer (not illustrated) may be provided between the microlens 10 and the protection layer 9. The planarization layer may also be an adhesive layer. The planarization layer may include the same resin as the microlens 10.

FIG. 8A illustrates a distance L from the semi-transparent electrode 8 to the microlenses 10, a height h of the microlenses 10, a radius φ of the microlenses 10, a distance D between vertices of adjacent microlenses 10, a refractive index $n_2$ of the protection layer 9, a refractive index $n_1$ of the microlenses 10, and an external refractive index no. The distance D does not have to be constant. More specifically, D may be configured to increase at shorter distances to end portions of the display region 1 or may be configured to decrease at shorter distances to end portions of the display region 1. According to the present exemplary embodiment, the height is a distance in a vertical direction on the paper surface.

Figure 8B:
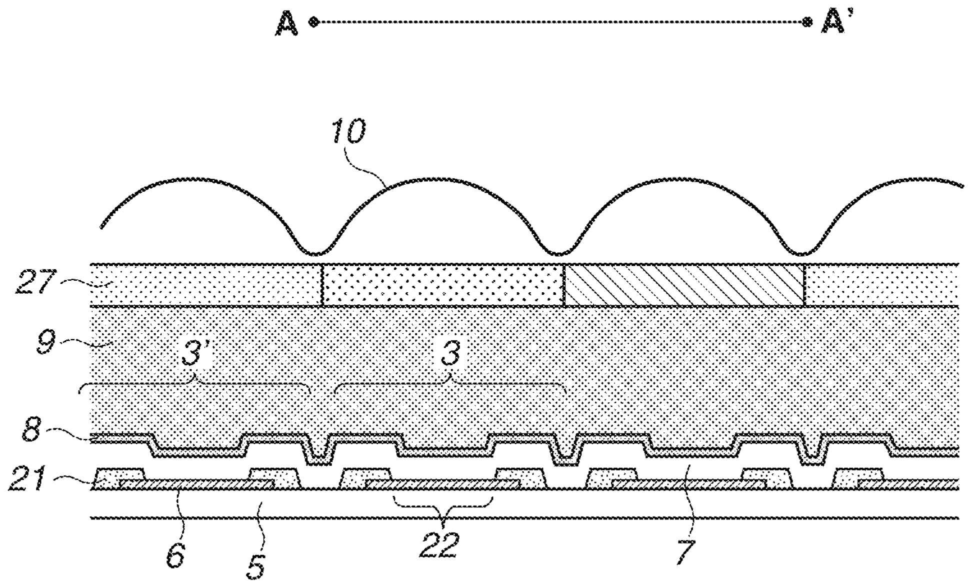
FIG. 8B is a diagram illustrating an example of another configuration of a light emitting apparatus according to an exemplary embodiment of the present invention.

FIG. 8B is a schematic diagram illustrating a cross section of a light emitting apparatus further including a color filter. A color filter 27 is further included between the protection layer 9 and the microlenses 10. The color filter 27 is a filter that transmits specific wavelengths. The color filter 27 may be, for example, a filter that transmits R among RGB. Three types of color filters that respectively transmit RGB may be included as illustrated in FIG. 8B.

Figure 8C:
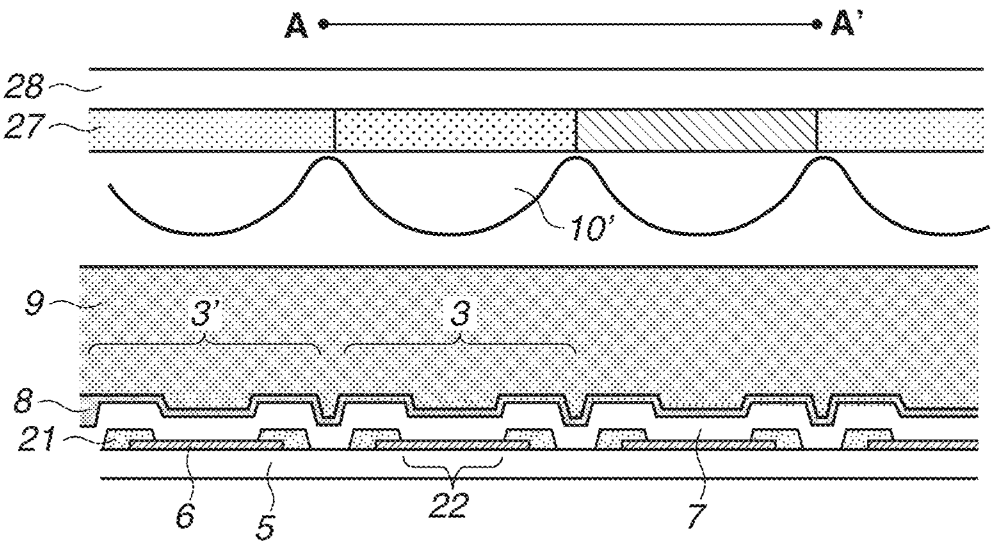
FIG. 8C is a diagram illustrating an example of another configuration of a light emitting apparatus according to an exemplary embodiment of the present invention.

FIG. 8C is a schematic diagram illustrating a cross section of a light emitting apparatus with a different form of color filters and microlenses. Unlike other exemplary embodiments, microlenses 10' are convex downward on the paper surface. The term "downward on the paper surface" can also be described as a direction from the semi-transparent electrode 8 toward the reflection layer 6. The space between the microlenses 10' and the protection layer 9 may be empty or filled with another material. A resin layer may be provided between the color filter 27 and the microlenses 10'.

A protection glass 28 is provided on the color filter 27. An organic layer, such as an adhesive layer, may be provided between the protection glass 28 and the color filter 27. Due to its placement position, the protection glass 28 is also referred to as an opposing substrate, because the protection glass 28 is positioned opposite to the substrate 5.

Figure 8D:
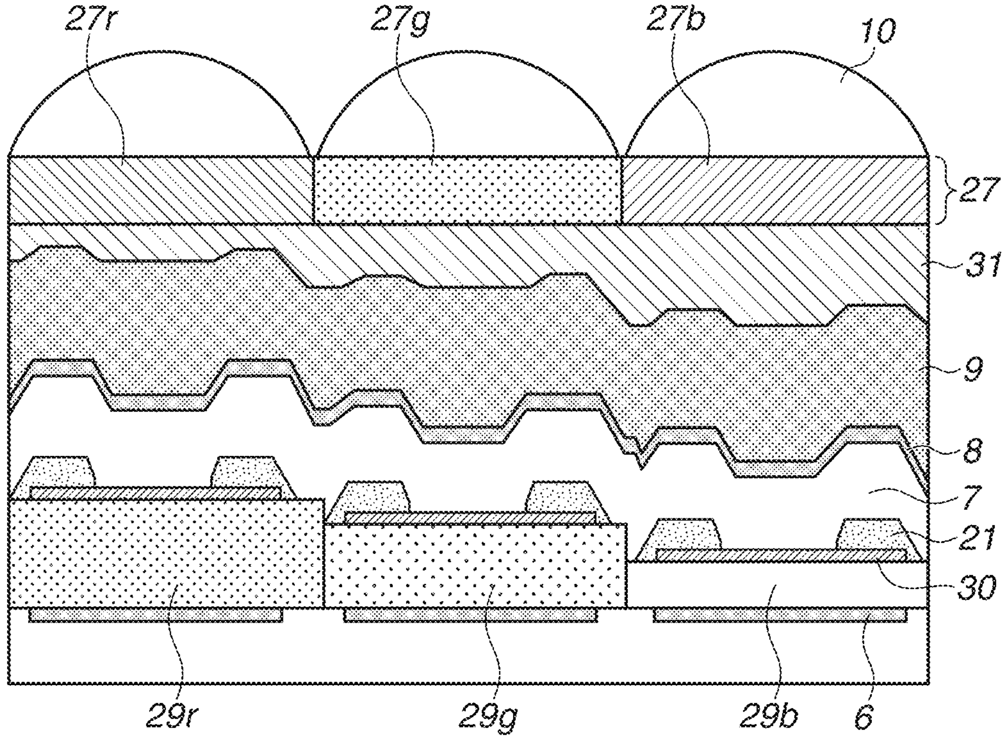
FIG. 8D is a diagram illustrating an example of another configuration of a light emitting apparatus according to an exemplary embodiment of the present invention.

FIG. 8D is a schematic diagram illustrating a cross section of a light emitting apparatus with different optical interference distances of light emitting elements for different luminous colors. On the reflection layer 6, an optical adjustment layer 29, a transparent electrode 30, the organic layer 7, the semi-transparent electrode 8, the protection layer 9, a filling layer 31, the color filter 27, and the microlenses 10 are disposed. The color filter 27 includes a red filter 27R, a green filter 27G, and a blue filter 27B in correspondence to their transmission colors. The optical distance between the reflection layer 6 and the semi-transparent electrode 8 varies depending on the thickness of the optical adjustment layer 29. In FIG. 8D, the light emitting element that intensifies blue, the light emitting element that intensifies green, and the light emitting element that intensifies red are disposed in this order from the right. The optical adjustment layer 29 of a first light emitting element is greater in thickness than the optical adjustment layer 29 of a second light emitting element. This form makes it possible to set an optimal optical interference distance for each luminous colors. While the optical adjustment layer 29 under the transparent electrode 30 changes the optical interference distance for each color according to the present exemplary embodiment, the optical adjustment layer 29 may be provided on the semi-transparent electrode 8. The optical interference distance for each light emitting element may be optimized by changing the layer thickness of the organic layer 7 for each light emitting element. In a case where the layer thickness of the organic layer 7 is to be changed for each light emitting element, it is desirable to change the layer thickness of the organic layer 7 on the reflection layer 6 side rather than the light emitting layer side.

The range of wavelengths that the color filter 27 transmits may include the PL peak wavelengths of the luminescent material. In a case where the PL peaks of the luminescent material include a first peak and a second peak smaller than the first peak and the luminance of the light emitting apparatus is prioritized, the first peak wavelength and the second peak wavelength may be included in the wavelength range that the color filter 27 transmits. In a case where the PL peaks of the luminescent material include a first peak and a second peak smaller than the first peak and the color purity of the light emitting apparatus is prioritized, only the first peak may be included in the wavelength range that the color filter 27 transmits.

The foregoing configuration is suitable for use in devices that prioritize luminance, such as head-mounted displays and augmented reality (AR) glasses.

[Light Emitting Element Configuration]

A light emitting element is provided by forming an insulation layer, a first electrode, an organic compound layer, and a second electrode on a substrate. On a cathode, a protection layer, a color filter, and a microlens may be provided. In a case where a color filter is provided, a planarization layer may be provided between the color filter and the protection layer. The planarization layer may be formed from acrylic resin. A similar applies to a case where a planarization layer is to be provided between the color filter and the microlens.

[Substrate]

The substrate may be quartz, glass, silicon wafer, resin, or metal. On the substrate, switching elements such as transistors and traces may be provided, and an insulation layer may be provided thereon. The insulation layer may be formed of any material in which contract holes can be formed to form traces to the first electrode and that can provide insulation from unconnected traces. For example, resin, such as polyimide, silicon oxide, and silicon nitride may be used.

[Light Emitting Element]

The light emitting element includes the first electrode, the second electrode, and a light emitting layer disposed between the first electrode and the second electrode and including a luminescent material. The light emitting layer may be an organic compound layer or an inorganic compound layer. The electrodes may also be a reflection layer. The luminescent material may be fluorescent or phosphorescent.

[Electrode]

Each electrode may use a pair of electrodes. The pair of electrodes may be an anode and a cathode. In a case where an electric field is applied in an emission direction of an organic light emitting element, the electrode with a high electric potential is the anode, and the other electrode is the cathode. It can also be said that the electrode that supplies holes to the light emitting layer is the anode and the electrode that supplies electrons to the light emitting layer is the cathode. The electrode may be formed across a plurality of light emitting elements or may be formed for each light emitting element separately. For example, the anode may be formed for each light emitting element separately, and the cathode may be formed across a plurality of light emitting elements.

Materials with a largest possible work function are suitable for use in the anode. For example, an elemental metal, such as gold, platinum, silver, copper, nickel, palladium, cobalt, selenium, vanadium, tungsten, or silicon, a mixture thereof, an alloy made of a combination of these metals, or a metal oxide, such as tin oxide, zinc oxide, indium oxide, indium tin oxide (ITO), or indium zinc oxide, may be used. Further, a conductive polymer, such as polyaniline, polypyrrole, or polythiophene, may be used.

One type of an electrode material described above may be used alone, or two or more types of these electrode materials may be used in combination. The anode may be composed of a single layer or a plurality of layers.

As the reflection layer, for example, chromium, aluminum, silver, titanium, tungsten, molybdenum, an alloy thereof, or stacked layers thereof may be used. The foregoing materials may function as the reflection layer without a role as an electrode. Examples of materials that may be used as the transparent electrode include, but are not limited to, an oxide transparent conductive layer, such as ITO or indium zinc oxide. In forming the electrodes, photolithography technology may be used. The reflection layer desirably has a reflectance of 70% or higher at the emission wavelength. The reflection layer may also be an electrode.

Materials with a small work function are suitable for use in the cathode. Examples include alkali metals, such as lithium, alkali earth metals, such as calcium, elemental metals, such as aluminum, titanium, manganese, silver, lead, or chromium, or mixtures thereof. An alloy made of a combination of these elemental metals may also be used. For example, magnesium-silver, aluminum-lithium, aluminum-magnesium, silver-copper, or zinc-silver may be used. A metal oxide, such as ITO, may also be used. One type of an electrode material described above may be used alone, or two or more types of these electrode materials may be used in combination. Further, the cathode may have a single-layer structure or a multi-layer structure. It is especially desirable to use silver, and in order to reduce aggregation of silver, use of a silver alloy is more desirable. Any alloy ratio that can reduce aggregation of silver may be used. For example, the ratio between silver and other metals may be 1:1 or 3:1.

The cathode is not particularly limited and may be a top emission element using an oxide conductive layer such as ITO or may be a bottom emission element using a reflection layer such as aluminum (Al). While cathode forming methods are not particularly limited, use of a direct-current and alternating-current sputtering method is desirable because it becomes possible to achieve excellent film coverage and reduce resistance.

As the semi-transparent electrode, a metal that transmits part of incident light and reflects part of incident light is used. A sufficiently thin metal layer may be formed and used as the semi-transparent electrode. For example, the semi-transparent electrode may be formed of about 10 nm of silver.

[Organic Layer]

The organic layer may be formed of a single layer or a plurality of layers. In a case where a plurality of layers is included, each layer may be referred to a hole injection layer, a hole transport layer, an electron blocking layer, a light emitting layer, a hole blocking layer, an electron transport layer, an electron injection layer, and a charge generation layer, based on its function. While the organic layer mainly includes an organic compound, an inorganic atom and/or an inorganic compound may also be included in the organic layer. For example, copper, lithium, magnesium, aluminum, iridium, platinum, molybdenum, and/or zinc may be included.

The organic layer may include a plurality of light emitting layers. Any one of the light emitting layers may include a red-emitting material, a green-emitting material, and a blue-emitting material, and by mixing their luminous colors, white light can be obtained. Further, any one of the light emitting layers may include light emitting materials that are in complementary colors, such as a blue-emitting material and a yellow-emitting material. The light emitting materials may be materials such as fluorescent materials, phosphorescent materials, or delayed fluorescent materials or may be quantum dots such as cadmium sulfide (CdS) or perovskite. The materials included in the light emitting layers and/or configurations may be changed for each light emitting element to emit different luminous colors. A light emitting layer may be formed for each light emitting element. The organic compound layer may be disposed between the first electrode and the second electrode and may be in contact with the first electrode and the second electrode.

[Protection Layer]

The protection layer is an insulation layer and desirably includes an inorganic material that has translucent properties and has low permeability to external oxygen and moisture. The protection layer may be formed using an inorganic material, such as silicon nitride (SiN), silicon oxynitride (SiON), silicon oxide (SiOx), aluminum oxide (such as $Al_2O_3$), or titanium oxide ($TiO_2$). The protection layer may be disposed directly on the cathode, or an organic resin layer may be provided between the protection layer and the cathode. The organic resin layer may include, for example, polyacrylate, polyimide, polyester, or epoxy.

A glass with a drying agent may be bonded onto the cathode to reduce infiltration of water and the like into the organic layer and reduce display defects. According to another exemplary embodiment, a passivation film, such as silicon nitride, may be provided onto the cathode to reduce infiltration of water and the like into the organic compound layer. For example, after a cathode is formed, the cathode is moved to another chamber without breaking the vacuum, and a silicon nitride film with a thickness of 2 m is formed with a chemical vapor deposition (CVD) method as a protection layer. A protection layer may be provided using an atomic layer deposition method (ALD method) after the film formation with the CVD method. Materials of films with the ALD method are not limited and may be silicon nitride, silicon oxide, or aluminum oxide. Silicon nitride may be formed using the CVD method on a film formed with the ALD method. The film formed with the ALD method may be smaller in thickness than the film formed with the CVD method. Specifically, the thickness may be 50% or less, or 10% or less.

[Color Filter]

The color film may be provided on the protection layer. For example, another substrate on which the color filter with the size of the organic light emitting element reflected is provided and the substrate on which the organic light emitting element is provided may be bonded together, or the color filter may be patterned on the protection layer using photolithography technology. The color filter may include a high-molecular-weight substance.

[Planarization Layer]

The planarization layer may be provided between the color filter and the protection layer. The planarization layer is provided to reduce the unevenness of a lower layer. The planarization layer may sometimes be referred to as a resin layer without limiting aims. The planarization layer may be composed of an organic compound, a low-molecular-weight substance, or a high-molecular-weight substance but is desirably composed of a high-molecular-weight substance.

The planarization layer may be provided on top and bottom of the color filter and may be composed of the same material or a different material. Specific examples include polyvinyl carbazole resin, polycarbonate resin, polyester resin, acrylonitrile butadiene styrene (ABS) resin, acrylic resin, polyimide resin, phenolic resin, epoxy resin, silicon resin, and urea resin.

[Microlens]

The organic light emitting apparatus may include an optical member, such as a microlens, on its light emitting side. The microlens may include acrylic resin, epoxy resin, and/or the like. The microlens may be intended to increase the quantity of light extracted from the organic light emitting apparatus and control a direction of light to be extracted. The microlens may have a hemispherical shape. In a case where the microlens has a hemispherical shape, there is a tangent line that is in contact with the hemispherical shape and is parallel to the insulation layer, and a point of tangency between the tangent line and the hemispherical shape is determined as a vertex of the microlens. The vertex of the microlens may be determined similarly in any cross-sectional view. Specifically, there is a tangent line that is in contact with the semicircle of the microlens in a cross-sectional view and is parallel to the insulation layer, and a point of tangency between the tangent line and the semicircle is determined as a vertex of the microlens.

A midpoint of the microlens may also be defined. In a cross section of the microlens, a line segment from an end point of an arc shape to an end point of another arc shape is assumed, and a midpoint of the line segment may be referred to as the midpoint of the microlens. The cross section for determining the vertex and the midpoint may be a cross section perpendicular to the insulation layer.

The microlens may be formed by adjusting exposure and development processes. Specifically, a film (photoresist film) is formed using materials for forming the microlens, and exposure and development processes are performed on the photoresist film using a mask with continuous gradation. Examples of usable masks as such a mask include a gray mask and an area tone mask that enables light irradiation with which continuous gradation is provided on an imaging surface by changing a density distribution of dots including light-shielding films with a resolution lower than or equal to a resolution of an exposure device.

The lens shape of the microlens formed through the exposure and development processes may be adjusted by performing etch back on the microlens. It is sufficient for the microlens to have a shape with an inclined part capable of refracting radiated light and may have a spherical shape or an asymmetric cross sectional shape.

[Opposing Substrate]

The opposing substrate may be provided on the planarization layer. The opposing substrate is referred to as an opposing substrate because it is positioned opposite to the substrate. Materials of the opposing substrate may be the same as those of the substrate. The opposing substrate may be a second substrate in a case where the substrate described above is a first substrate.

[Organic Layer Formation]

The organic compound layer (hole injection layer, hole transport layer, electron blocking layer, light emitting layer, hole blocking layer, electron transport layer, electron injection layer, charge generation layer) of the organic light emitting element according to an exemplary embodiment of the present invention is formed with the following method.

A dry processes, such as a vacuum deposition method, an ionized deposition method, sputtering, or plasma, may be used for the organic compound layer of the organic light emitting element according to an exemplary embodiment of the present invention. A wet process for forming a layer by dissolving in a suitable solvent and using a publicly-known coating method (e.g., spin coating, dipping, casting method, Langmuir-Blodgett [LB] method, inkjet method) may be used in place of the dry processes.

A layer formed with the vacuum deposition method or a solution coating method is less likely to be crystallized and has excellent long-term stability. Further, in forming a film using a coating method, a suitable binder resin may be used in combination to form a film.

Examples of the binder resin include, but are not limited to, polyvinyl carbazole resin, polycarbonate resin, polyester resin, ABS resin, acrylic resin, polyimide resin, phenolic resin, epoxy resin, silicon resin, and urea resin.

One type of a binder resin described above may be used alone as a homopolymer or a copolymer, or two or more types of these binder resins may be used in mixture. Furthermore, a publicly-known additive, such as a plasticizing agent, an antioxidant, or an ultraviolet absorbing agent may be used in combination as needed.

[Pixel Circuit]

The light emitting apparatus may include pixel circuits connected to the light emitting elements. The pixel circuits may be active matrix pixel circuits that control light emission from a first light emitting element and a second light emitting element separately. The active matrix circuits may use either voltage programming or current programming. A drive circuit includes a pixel circuit for each pixel. Each pixel circuit may include a light emitting element, a transistor for controlling the luminance of light emitted by the light emitting element, a transistor for controlling timings to emit light, a capacitor for storing a gate voltage of the transistor that controls the luminance of light to be emitted, and a transistor for connecting to a ground (GND) without a light emitting element.

The light emitting apparatus includes a display region and a peripheral region around the display region. The pixel circuits are disposed in the display region, and a display control circuit is disposed in the peripheral region. The mobility of the transistors of the pixel circuits may be lower than the mobility of transistors of the display control circuit.

A slope of a current-voltage characteristic of the transistors of the pixel circuits may be smaller than a slope of a current-voltage characteristic of the transistors of the display control circuit. The slope of the current-voltage characteristic may be measured based on a Vg-Ig characteristic.

The transistors of the pixel circuits are transistors that are connected to the light emitting elements, such as the first light emitting element.

[Pixel]

The organic light emitting apparatus includes a plurality of pixels. The pixels include sub-pixels that emit light of a different color from each other. The sub-pixels may each include, for example, RGB luminous colors.

A region that is also referred to as a pixel opening in each pixel emits light. This region is the same as a first region. The pixel opening may be 15 μm or less and 5 μm or greater. More specifically, the pixel opening may be 11 μm, 9.5 μm, 7.4 μm, or 6.4 μm.

The space between the sub-pixels may be 10 μm or less, specifically 8 μm, 7.4 μm, or 6.4 μm.

The pixels may be in a publicly-known arrangement pattern in a plan view. Examples include stripe arrangement, delta arrangement, pentile arrangement, and Bayer arrangement. The sub-pixels may be in any publicly-known shape in a plan view. Examples include quadrilaterals such as rectangles and rhombuses and hexagons. Naturally, a shape that is not accurate but close to a rectangle is included in rectangles. The shape of the sub-pixels and the pixel arrangement may be used in combination.

EXAMPLES

Example 1

Next, specific effects of the present invention will be described below with reference to examples. The present example was conducted using single-color organic light emitting elements. Table 1 presents a microlens height h/D normalized by a pixel pitch D, a microlens radius Φ/D, and a height L2/D of an upper surface of the color filter.

As described above, effects of the present invention are independent of whether it is a single color or white, and a color filter may be provided separately.

TABLE 1

| | |
|---|---|
| Microlens height h/D | 0.35 |
| Microlens radius Φ/D | 0.47 |
| Height L2/D from semi-transparent electrode to lower surface of microlens | 0.56 |

Figure 9:
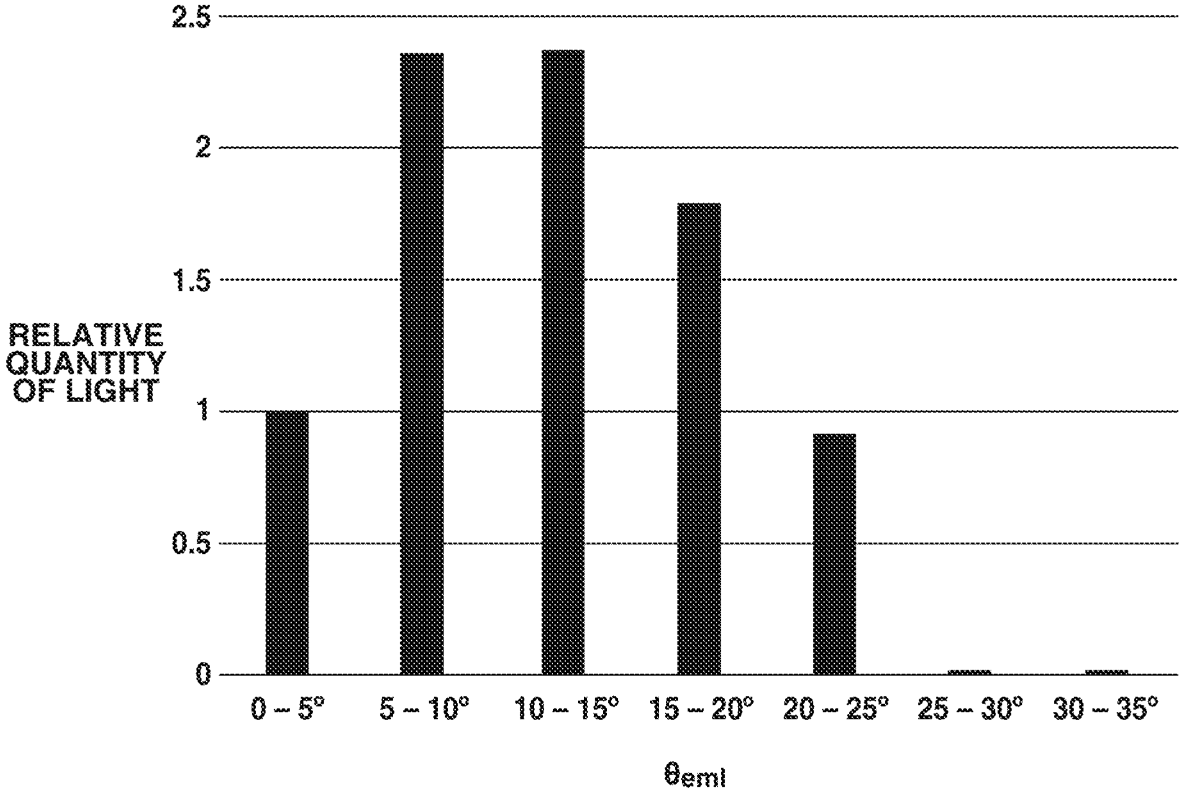
FIG. 9 is a diagram illustrating a relationship between radiation angle and a relative quantity of light in a light emitting layer that are obtained by ray tracking.
Figure 10:
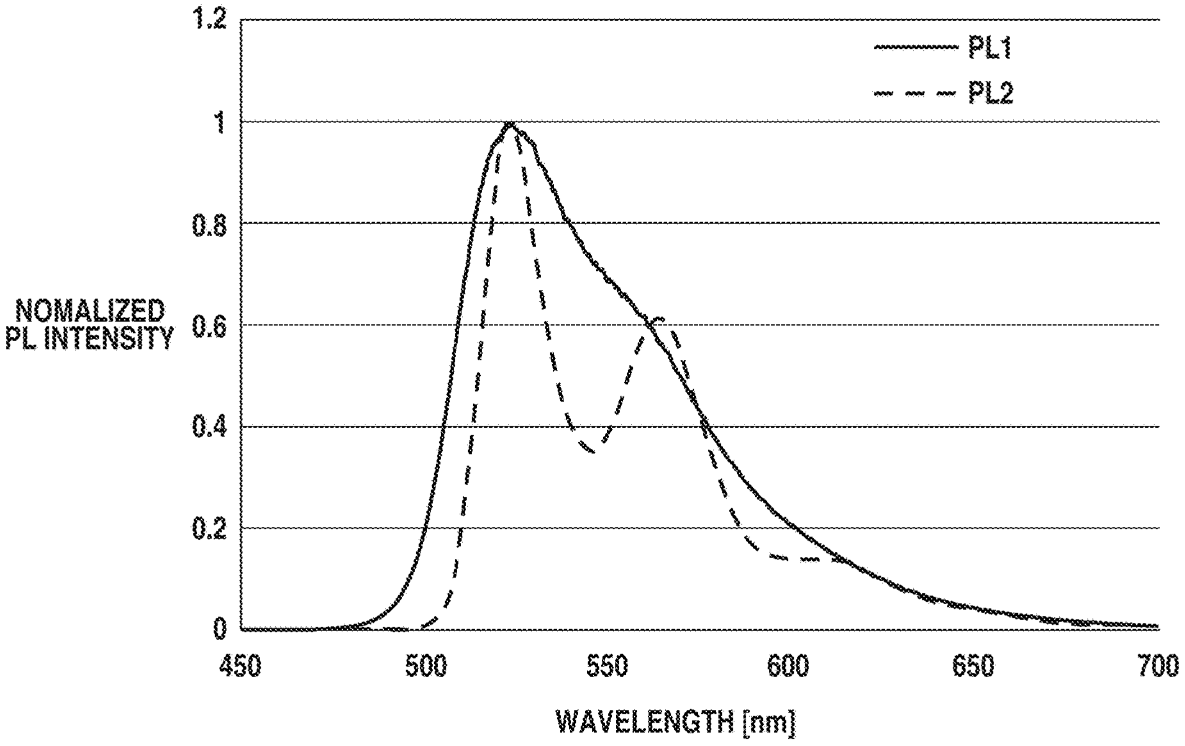
FIG. 10 illustrates a PL spectrum PL1 of a luminescent material used in Example 1.

FIG. 9 is a diagram illustrating a relationship between radiation angle and a relative quantity of light in the light emitting layer that are obtained through ray tracking. In ray tracking with the configuration in Table 1, a maximum relative quantity of light in the front direction was reached at 10° to 15°, as illustrated in FIG. 9. Example 1 was conducted with an aluminum (Al) electrode as a reflection layer, 15 nm of MgAg as a semi-transparent electrode, and a SiN film as a protection layer. A microlens was formed using a material with a refractive index n=1.5. FIG. 10 illustrates a PL spectrum PL1 of the luminescent material used in Example 1. The maximum peak wavelength of the PL spectrum was 523 nm.

TABLE 2

| | | Interference Order | | | | | With Microlens | | Without Microlens | | | |
|---|---|---|---|---|---|---|---|---|---|---|---|---|
| | | m | m' | $\lambda_{PL}$ | $\lambda_{on}$ | $\lambda_{off}$ | Relative Radiant Intensity | $\lambda_{EL}(0)$ | Relative Radiant Intensity | $\lambda_{EL}$ | $\lvert\lambda_{EL} - \lambda_{PL}\rvert$ | $\lvert\lambda_{on} - \lambda_{PL}\rvert$ |
| D001 | Comparative Example | 1 | 0 | 523 nm | 523 nm | 504 nm | 1 | 523 nm | 1 | 519 nm | 4.0 nm | 0 nm |
| D101 | Example | 1 | 0 | 523 nm | 545 nm | 525 nm | 1 | 542 nm | 1.36 | 529 nm | 6.0 nm | 22 nm |
| D102 | Example | 1 | 0 | 523 nm | 552 nm | 531 nm | 0.99 | 549 nm | 1.4 | 530 nm | 7.0 nm | 29 nm |

Table 2 presents study results. In the present example, studies were conducted under the condition that the interference order m between the reflection layer and the emission point in equation (4) is one and the interference order m' from the emission point to the semi-transparent electrode is zero. A comparative example D001 is a configuration in which the interference peak resonance wavelength $\lambda_{on}$ in the front direction and $\lambda_{PL}$ match under the foregoing condition and the interference peak resonance wavelength $\lambda_{off}$ in the direction that is inclined with respect to the main surface of the substrate is located on the shorter wavelength side of $\lambda_{PL}$. Examples D101 and D102 are a configuration in which the interference peak resonance wavelength $\lambda_{off}$ in the direction that is inclined with respect to the main surface of the substrate is close to $\lambda_{PL}$ under the condition that $\lambda_{on}$ is 545 nm for D101 and 552 nm for D102. In Table 2, relative radiant intensities for the configuration without a microlens and the configuration with a microlens are values normalized by the radiance according to the comparative example.

Initially, characteristics of the organic light emitting elements without a microlens are compared. Regarding the interference conditions in D101 and D102 as compared with D001, it is found that in the configuration without a microlens, the EL spectrum peak intensity $\lambda_{EL}(0)$ in the front direction shifts toward the loner wavelength side of $\lambda_{PL}$, and the relative radiant intensity is 1 or 0.99, which is the same or decreased. In contrast to this, in the configuration with a microlens, the relative radiant intensity is increased to 1.36 for D101 and 1.4 for D102, and the EL peak wavelength $\lambda_{EL}$ is 529 nm for D101 and 530 nm for D102, which are close to $\lambda_{PL}$=523 nm. This is due to the components that are refracted in the front direction at the inclined part of the microlens illustrated in FIG. 5B and has the highest contribution near Θeml. The difference $|\lambda_{off}-\lambda_{PL}|$ between the interference peak resonance wavelength in the front direction and the PL peak wavelength is 22 nm for D101 and 29 nm for D102, and the difference $|\lambda_{EL}-\lambda_{PL}|$ between the EL peak wavelength and the PL peak wavelength is 6 nm for D101 and 7 nm for D102. Thus, the radiance of the organic light emitting element with the light extraction structure in the front direction can be increased by adjusting the optical interference of an organic EL element in such a manner that $|\lambda_{EL}-\lambda_{PL}|$ becomes smaller than $|\lambda_{off}-\lambda_{PL}|$.

Example 2 is similar to Example 1, except that the spectrum shape of the luminescent material has double peaks. The double peaks refer to the inclusion of first and second peaks in an emission spectrum.

TABLE 3

| | | Interference Order | | | | | With Microlens | | Without Microlens | | | |
|---|---|---|---|---|---|---|---|---|---|---|---|---|
| | | m | m' | $\lambda_{PL}$ | $\lambda_{on}$ | $\lambda_{off}$ | Relative Radiant Intensity | $\lambda_{EL}(0)$ | Relative Radiant Intensity | $\lambda_{EL}$ | $\lvert\lambda_{EL} - \lambda_{PL}\rvert$ | $\lvert\lambda_{on} - \lambda_{PL}\rvert$ |
| D002 | Comparative Example | 1 | 0 | 523 nm | 523 nm | 504 nm | 1 | 523 nm | 1 | 522 nm | 1.0 nm | 0 nm |
| D103 | Example | 1 | 0 | 523 nm | 545 nm | 525 nm | 1 | 542 nm | 1.4 | 524 nm | 1.0 nm | 22 nm |
| D104 | Example | 1 | 0 | 523 nm | 552 nm | 531 nm | 0.98 | 549 nm | 1.45 | 524 nm | 1.0 nm | 29 nm |

Table 3 presents the radiant intensities in the front direction at $\lambda_{PL}$, $\lambda_{on}$, and $\lambda_{off}$ in Example 2. The differences between $\lambda_{PL}$, $\lambda_{EL}$, and $\lambda_{on}$ for each condition are presented. A comparative example D002 is a configuration in which the interference peak resonance wavelength $\lambda_{on}$ in the front direction and $\lambda_{PL}$ match under the foregoing condition and the interference peak resonance wavelength $\lambda_{off}$ in the direction that is inclined with respect to the main surface of the substrate is located on the shorter wavelength side with respect to $\lambda_{PL}$. Examples D103 and D104 are a configuration in which the interference peak resonance wavelength $\lambda_{off}$ in the direction that is inclined with respect to the main surface of the substrate is close to $\lambda_{PL}$ under the condition that $\lambda_{on}$ is 545 nm for D103 and 552 nm for D104. In Table 3, relative radiant intensities are values normalized by the radiance according to D002.

Initially, the configurations without a microlens will be compared. As to the interference conditions of D103 and D104 as compared with D002, in the case without a microlens, the EL spectrum peak intensity $\lambda_{EL}$(O) in the front direction is shifted to 542 nm and 549 nm to the longer wavelength side with respect to $\lambda_{PL}$=523 nm, and the relative radiant intensity is 1 and 0.98, which is the same or decreased. In contrast to this, in the case with a microlens, the relative radiances of D103 and D104 both increase to 1.4 and 1.45, respectively. The EL peak wavelength $\lambda_{EL}$ becomes 524 nm in both cases, which is close to $\lambda_{PL}$=523 nm. This is due to the component that is refracted in the front direction at the inclined part of the microlens illustrated in FIG. 5B and has the highest contribution near Θeml. The difference $|\lambda_{off}-\lambda_{PL}|$ between the interference peak resonance wavelength $\lambda_{on}$ in the front direction and the PL peak wavelength is 22 nm for D103 and 29 nm for D104, whereas the difference $|\lambda_{EL}-\lambda_{PL}|$ between the EL peak wavelength and the PL peak wavelength is 1 nm for both D103 and D104. It is found that the present invention is advantageous even for a light emitting dopant having a PL spectrum shape with a second peak such as PL2.

Example 3

Example 3 is similar to Example 2, except that the interference order m between the reflection layer and the emission point is 0 and the semi-transparent electrode is 23 nm. Table 4 presents study results on Example 3.

TABLE 4

| | | Interference Order | | | | | With Microlens | | Without Microlens | | | |
|---|---|---|---|---|---|---|---|---|---|---|---|---|
| | | m | m' | $\lambda_{PL}$ | $\lambda_{on}$ | $\lambda_{off}$ | Relative Radiant Intensity | $\lambda_{EL}(0)$ | Relative Radiant Intensity | $\lambda_{EL}$ | $\|\lambda_{EL}-\lambda_{PL}\|$ | $\|\lambda_{on}-\lambda_{PL}\|$ |
| D003 | Comparative Example | 0 | 0 | 523 nm | 524 nm | 510 nm | 1 | 524 nm | 1 | 522 nm | 1.0 nm | 1 nm |
| D105 | Example | 0 | 0 | 523 nm | 539 nm | 524 nm | 0.9 | 528 nm | 1.36 | 524 nm | 1.0 nm | 16 nm |

A comparative example D003 is a configuration in which the interference peak resonance wavelength $\lambda_{on}$ in the front direction and $\lambda_{PL}$ match under the foregoing condition, and the interference peak resonance wavelength $\lambda_{off}$ in the direction that is inclined with respect to the main surface of the substrate is located on the shorter wavelength side with respect to $\lambda_{PL}$. The present example D105 is a configuration in which the interference peak resonance wavelength $\lambda_{off}$ in the direction that is inclined with respect to the main surface of the substrate is 524 nm, which is close to $\lambda_{PL}$=523 nm, under the condition that $\lambda_{on}$ is 539 nm. Relative radiant intensities in Table 4 are values normalized by the radiance of D003.

Initially, the configurations without a microlens will be compared. As to the interference condition of D105 compared to D003, in the case without a microlens, the EL spectrum peak intensity $\lambda_{EL}$(O) in the front direction is shifted to 528 nm on the longer wavelength side with respect to $\lambda_{PL}$=523 nm. The relative radiant intensity decreases to 0.9. In the case with a microlens, the relative radiance of D105 increases to 1.36. The EL peak wavelength $\lambda_{EL}$ becomes 524 nm, which is close to $\lambda_{PL}$=523 nm. This is due to the component that is refracted in the front direction at the inclined part of the microlens illustrated in FIG. 5B and has the highest contribution near $\Theta_{eml}$. As to D105, the difference $|\lambda_{off}-\lambda_{PL}|$ between the interference peak resonance wavelength $\lambda_{on}$ in the front direction and the PL peak wavelength is 16 nm, whereas the difference $|\lambda_{EL}-\lambda_{PL}|$ between the EL peak wavelength and the PL peak wavelength is 1 nm. It is found that the present invention produces advantageous effects even in a case where the interference order m between the reflection layer and the emission point is 0.

Example 4

Example 4 is similar to Example 2, except that the interference order m' between the semi-transparent electrode and the emission point is 1. Table 5 presents study results on Example 4.

TABLE 5

| | | Interference Order | | | | | With Microlens | | Without Microlens | | | |
|---|---|---|---|---|---|---|---|---|---|---|---|---|
| | | m | m' | $\lambda_{PL}$ | $\lambda_{on}$ | $\lambda_{off}$ | Relative Radiant Intensity | $\lambda_{EL}(0)$ | Relative Radiant Intensity | $\lambda_{EL}$ | $\lvert\lambda_{EL}-\lambda_{PL}\rvert$ | $\lvert\lambda_{on}-\lambda_{PL}\rvert$ |
| D004 | Comparative Example | 0 | 1 | 523 nm | 523 nm | 505 nm | 1 | 524 nm | 1 | 521 nm | 2 nm | 0 nm |
| D106 | Example | 0 | 1 | 523 nm | 538 nm | 520 nm | 0.84 | 528 nm | 1.13 | 524 nm | 1 nm | 15 nm |

A comparative example D004 is a configuration in which the interference peak resonance wavelength $\lambda_{on}$ in the front direction and $\lambda_{PL}$ match under the foregoing condition and the interference peak resonance wavelength $\lambda_{off}$ in the direction that is inclined with respect to the main surface of the substrate is on the shorter wavelength side with respect to $\lambda_{PL}$. The present example D106 is a configuration in which the interference peak resonance wavelength $\lambda_{off}$ in the direction that is inclined with respect to the main surface of the substrate is 520 nm, which is close to $\lambda_{PL}$=523 nm, under the condition that $\lambda_{on}$ is 538 nm. In Table 5, relative radiant intensities are values normalized by the radiance according to D004.

Initially, the configurations without a microlens will be compared. As to the interference conditions of D106 compared to D004, in the case without a microlens, the EL spectrum peak intensity $\lambda_{EL}$(O) in the front direction is shifted to 528 nm on the longer wavelength side with respect to $\lambda_{PL}$=523 nm. The relative radiant intensity decreases to 0.84. In the case with a microlens, the relative radiance of D105 increases to 1.13. The EL peak wavelength $\lambda_{EL}$ becomes 524 nm, which is close to $\lambda_{PL}$=523 nm. This is due to the component that is refracted in the front direction at the inclined part of the microlens illustrated in FIG. 5B and has the highest contribution near $\Theta_{eml}$. As to D106, the difference $|\lambda_{off}-\lambda_{PL}|$ between the interference peak resonance wavelength $\lambda_{on}$ in the front direction and the PL peak wavelength is 15 nm, whereas the difference $|\lambda_{EL}-\lambda_{PL}|$ between the EL peak wavelength and the PL peak wavelength is 1 nm. It is found that the present invention produces advantageous effects even in a case where the interference order m between the semi-transparent electrode and the emission point is 1.

The foregoing indicates that advantageous effects of the present invention are independent of shapes of PL spectra of light emitting dopants or interference orders.

Use of Organic Light Emitting Element According to Exemplary Embodiment of Present Invention An organic light emitting element according to an exemplary embodiment of the present invention can be used as a component of a display apparatus and an illumination apparatus. Other examples of applications include exposure light sources of electrophotographic image forming apparatuses, backlights of liquid crystal display apparatuses, and light emitting apparatuses including a white light source with color filters.

A display apparatus may be an image and information processing apparatus that includes an image input unit to which image information is input from an area charge-coupled device (area CCD), a linear charge-coupled device (linear CCD), or a memory card and an information processing unit configured to process input information and displays input images on a display unit.

A display unit of an imaging apparatus or an inkjet printer may have a touch panel function. Driving methods of the touch panel function are not particularly limited, and any method such as an infrared method, a capacitive method, a resistive film method, or an electromagnetic induction method may be used. Further, the display apparatus may be used in a display unit of a multi-function printer.

Next, the display apparatus according to the present exemplary embodiment will be described below with reference to the drawings.

A light emitting element according to an exemplary embodiment of the present invention may be used in an image forming apparatus. The image forming apparatus includes a photosensitive member, an exposure light source, a development portion, a charging portion, a transfer device, a conveyance roller, and a fixing device.

The exposure light source emits light, and an electrostatic latent image is formed on a surface of the photosensitive member. This exposure light source includes the organic light emitting element according to the present exemplary embodiment. The development portion includes toner. The charging portion charges the photosensitive member. The transfer device transfers a developed image onto a recording medium. The conveyance portion conveys the recording medium. The recording medium is, for example, paper. The fixing portion fixes the image formed on the recording medium.

The exposure light source may include a plurality of light emitting portions arranged on an elongated substrate. A row direction in which organic light emitting elements are arranged may correspond to a shaft direction of the photosensitive member. The row direction corresponds to a direction of an axis about which the photosensitive member rotates. This direction may also be referred to as a long-shaft direction of the photosensitive member.

The light emitting portions may be arranged alternately in each of first and second rows in the row direction. The first and second rows are at different positions in a column direction.

In the first row, the plurality of light emitting portions may be disposed at intervals. The second row includes a light emitting portion at each position corresponding to an interval between light emitting portions in the first row. Specifically, a plurality of light emitting portions may be disposed at intervals also in the column direction. The light emitting elements may be arranged, for example, in a lattice pattern, in a herringbone pattern, or in a checkerboard pattern.

Figure 11:
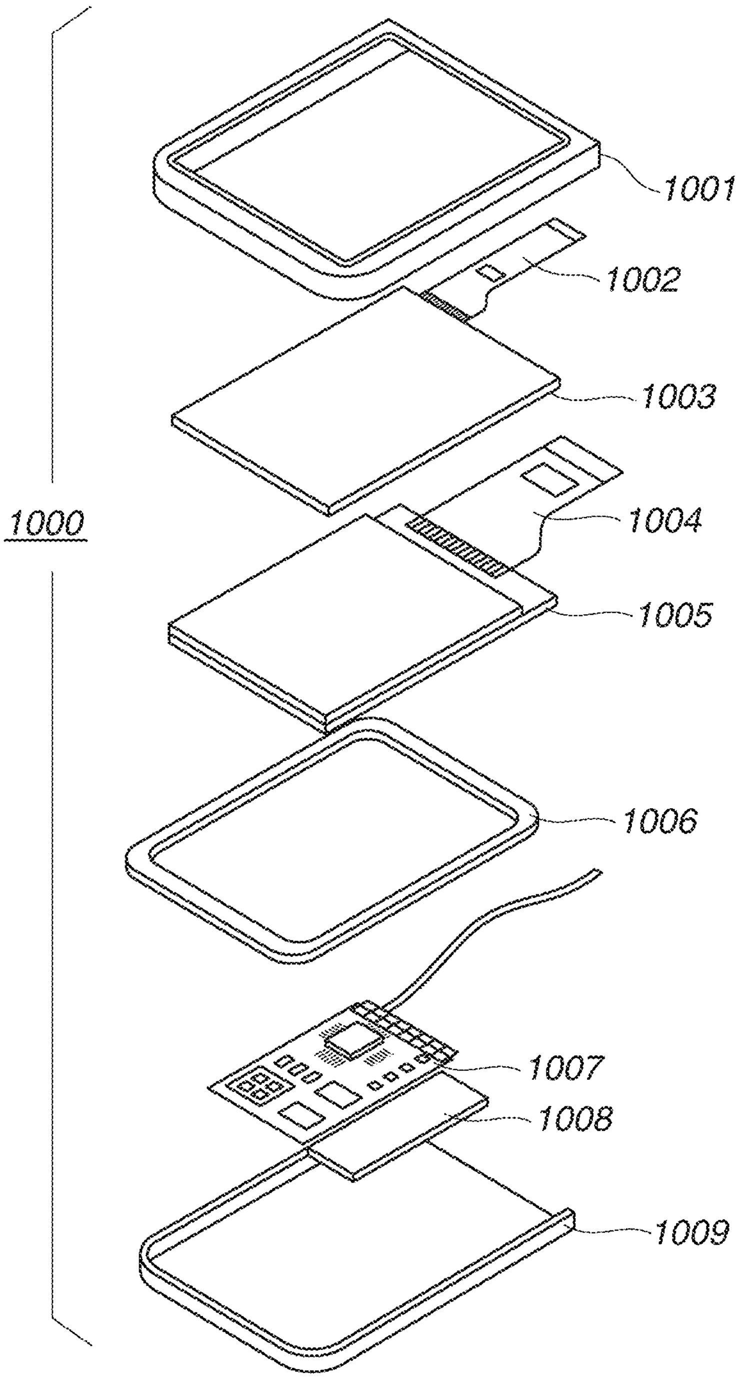
FIG. 11 is a schematic diagram illustrating an example of a light emitting apparatus according to an exemplary embodiment of the present exemplary embodiment.

FIG. 11 is a schematic diagram illustrating an example of a light emitting apparatus according to the present exemplary embodiment. A display apparatus 1000 may include, between an upper cover 1001 and a lower cover 1009, a touch panel 1003, a display panel 1005, a frame 1006, a circuit substrate 1007, and a battery 1008. A flexible printed circuit (FPC) 1002 is connected to the touch panel 1003, and a FPC 1004 is connected to the display panel 1005. Transistors are printed on the circuit substrate 1007. The battery 1008 may be omitted in a case where the display apparatus is not a mobile device, and even in a case where the display apparatus is a mobile device, the battery 1008 may be provided at a different position. The display panel 1005 includes a light emitting apparatus.

The display apparatus according to the present exemplary embodiment may include color filters including red, green, and blue. The color filters of red, green, and blue may be arranged in a delta array.

The display apparatus according to the present exemplary embodiment may be used in a display unit of a mobile terminal. In this case, both a display function and an operation function may be included. Examples of mobile terminals include mobile phones, such as smartphones, tablets, and head-mounted displays. A display control unit configured to control display images may be included.

The light emitting apparatus according to the present exemplary embodiment may be used in a display unit of an imaging apparatus that includes an optical unit including a plurality of lenses and an image sensor configured to receive light transmitted through the optical unit. The imaging apparatus may include a display unit configured to display information acquired by the image sensor. The display unit may be a display unit that is externally exposed from the imaging apparatus or may be a display unit disposed in a finder. The imaging apparatus may be a digital camera or a digital video camera.

Figure 12A:
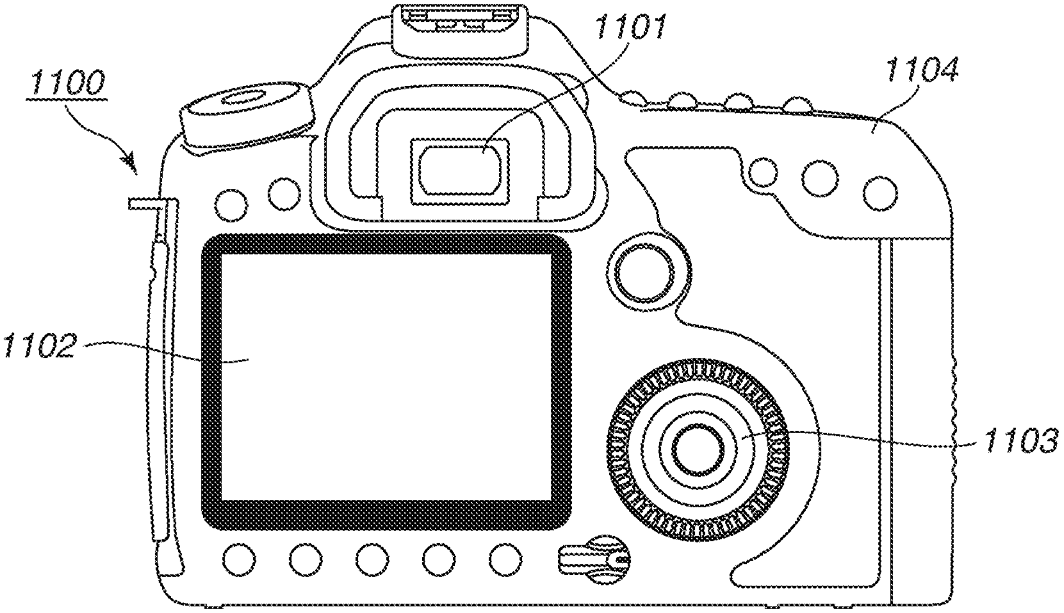
FIG. 12A is a schematic diagram illustrating an example of an imaging apparatus according to an exemplary embodiment of the present exemplary embodiment.

FIG. 12A is a schematic diagram illustrating an example of an imaging apparatus according to the present exemplary embodiment. An imaging apparatus 1100 includes a viewfinder 1101, a rear display 1102, an operation unit 1103, and a housing 1104. The viewfinder 1101 may include the light emitting apparatus according to the present exemplary embodiment. In this case, the display apparatus may display not only captured images but also environment information and imaging instructions. The environment information may be the intensity and direction of external light, the speed at which a subject moves, and the possibility of the subject being obstructed by an obstacle.

A suitable timing for imaging is very short, so that it is desirable to display information as quickly as possible. Thus, it is desirable to use the organic light emitting apparatus according to the present exemplary embodiment. This is because the response speed of the organic light emitting element is fast. The organic light emitting apparatus is suitable for use in these apparatuses and liquid crystal display apparatuses that are demanded to have a fast display speed.

The imaging apparatus 1100 includes an optical unit (not illustrated). The optical unit includes a plurality of lenses and forms an image on an image sensor stored in the housing 1104. A focal point can be adjusted by adjusting the relative positions of the plurality of lenses. This operation may be performed automatically. The imaging apparatus may be referred to as a photoelectric conversion apparatus. The photoelectric conversion apparatus may include a method of detecting differences from previous images and a method of cutting from images recorded constantly as imaging methods instead of capturing images sequentially.

Figure 12B:
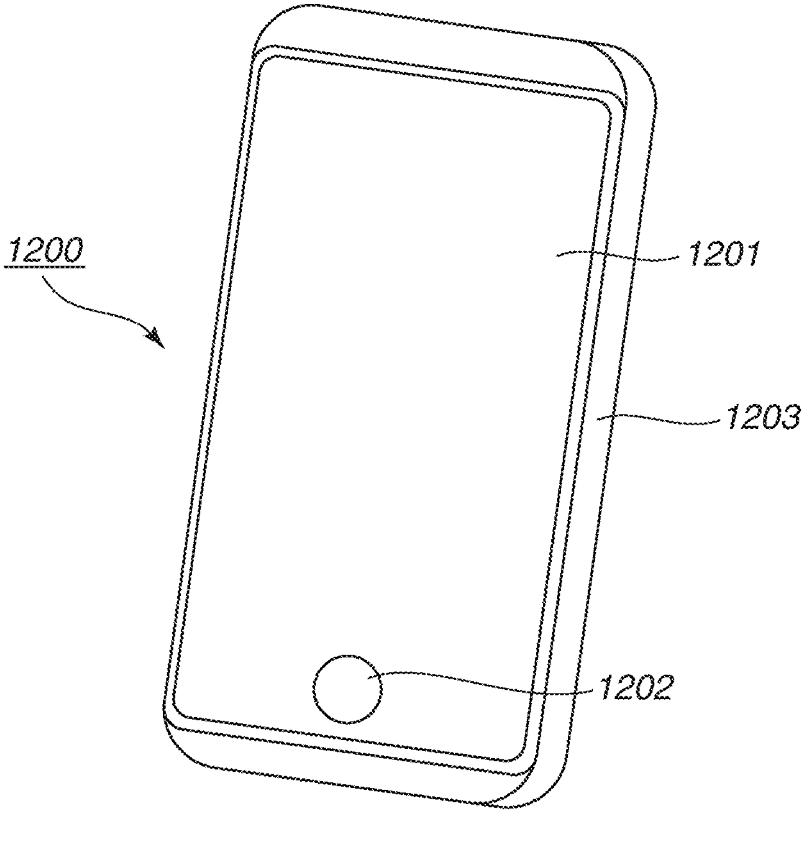
FIG. 12B is a schematic diagram illustrating an example of an electronic device according to an exemplary embodiment of the present exemplary embodiment.

FIG. 12B is a schematic diagram illustrating an example of an electronic device according to the present exemplary embodiment. An electronic device 1200 includes a display unit 1201, an operation unit 1202, and a housing 1203. The housing 1203 may include a circuit, a printed board including the circuit, a battery, and a communication unit. The operation unit 1202 may be buttons or a reactive portion using a touch panel method. The operation unit 1202 may be a biometric authentication unit configured to recognize fingerprints and perform unlock. The electronic device 1200 including the communication unit may also be referred to as a communication device. The electronic device 1200 may further include a lens and an image sensors to have a camera function. Images captured using the camera function are displayed on the display unit 1201. Examples of the electronic device 1200 include smartphones and laptop personal computers.

Figure 13A:
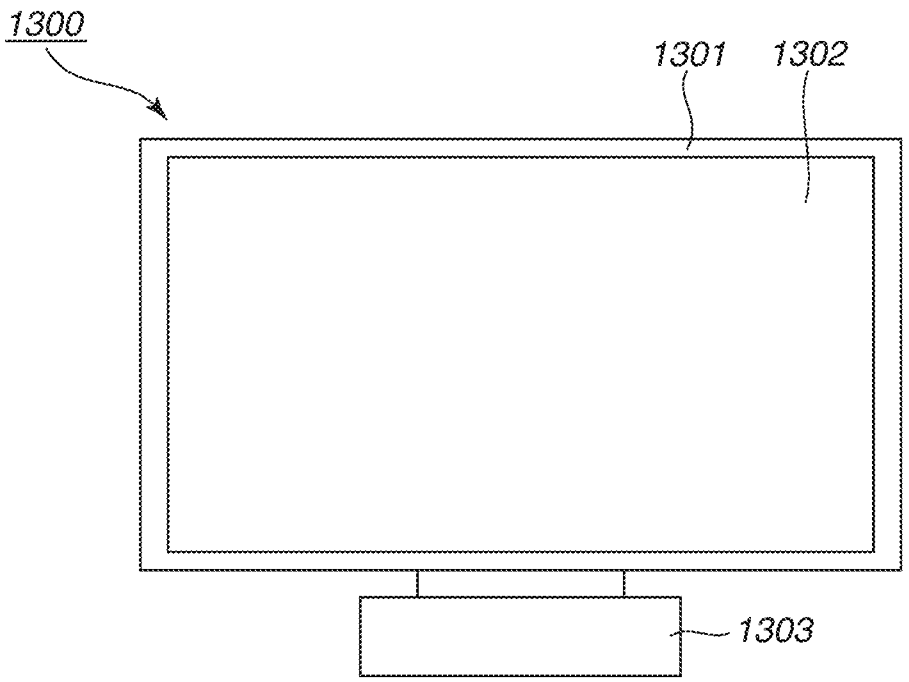
FIG. 13A is a schematic diagram illustrating an example of a display apparatus according to an exemplary embodiment of the present exemplary embodiment.
Figure 13B:
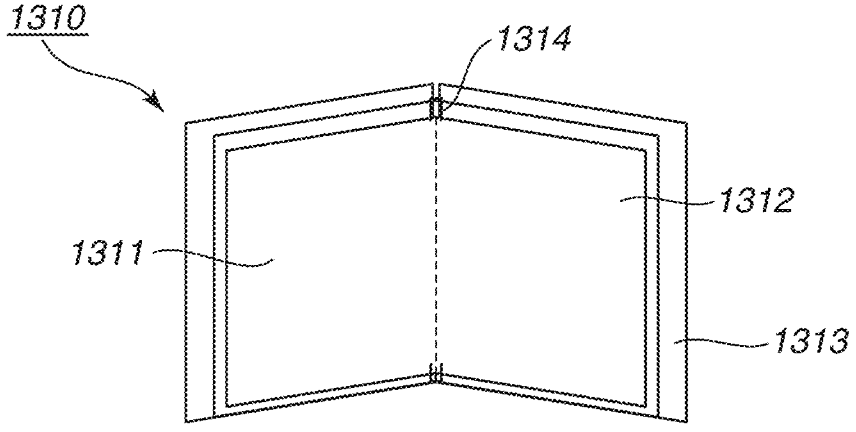
FIG. 13B is a schematic diagram illustrating an example of a foldable display apparatus.

FIGS. 13A and 13B are schematic diagrams illustrating an example of the light emitting apparatus according to the present exemplary embodiment. FIG. 13A illustrates a display apparatus such as a television monitor or a personal computer (PC) monitor. A display apparatus 1300 includes a frame 1301 and a display unit 1302. The light emitting apparatus according to the present exemplary embodiment may be used in the display unit 1302.

The frame 1301 and a base 1303 supporting the display unit 1302 are included. The base 1303 is not limited to the form illustrated in FIG. 4A. A lower side of the frame 1301 may be a base.

The frame 1301 and the display unit 1302 may be bent. Their radii of curvature may be 5000 mm or more and 6000 mm or less.

FIG. 13B is a schematic diagram illustrating another example of the light emitting apparatus according to the present exemplary embodiment. A display apparatus 1310 in FIG. 13B is foldable and is a foldable display apparatus. The display apparatus 1310 includes a first display unit 1311, a second display unit 1312, a housing 1313, and a folding point 1314. The first display unit 1311 and the second display unit 1312 may include the light emitting apparatus according to the present exemplary embodiment. The first display unit 1311 and the second display unit 1312 may be a single seamless display apparatus. The first display unit 1311 and the second display unit 1312 may be separated along the folding point 1314. The first display unit 1311 and the second display unit 1312 may display a different image from each other or may display a single image together.

The light emitting apparatus according to the present exemplary embodiment may be used in an illumination apparatus. The illumination apparatus may include a housing, a light source, a circuit substrate, an optical film, and a light diffusion portion. The light source may include the light emitting apparatus according to the present exemplary embodiment. The optical filter may be a filter that enhances color rendering of the light source. The light diffusion portion effectively diffuses light of the light source, such as illumination, and delivers the light over a wide area. The optical filter and the light diffusion portion may be provided on the light emitting side of the illumination. An outermost cover may be provided, as appropriate.

The illumination apparatus is, for example, an apparatus configured to illuminate the inside of a room. The illumination apparatus may be configured to emit light of any color, such as white, daylight white, or a color between blue and red. A dimming circuit configured to adjust the light may be included. The illumination apparatus may include the organic light emitting element according to the present exemplary embodiment and a power supply circuit connected to the organic light emitting element. The power supply circuit converts alternating current voltage into direct current voltage. White refers to a color temperature of 4200K, and daylight white refers to a color temperature of 5000K. The illumination apparatus may include a color filter.

The illumination apparatus according to the present exemplary embodiment may include a heat dissipation portion. The heat dissipation portion releases heat in the apparatus to the outside of the apparatus, and examples thereof include metals with high specific heat and liquid silicon.

The light emitting apparatus according to the present exemplary embodiment may be used in a movable object such as a vehicle. The vehicle includes a taillight as an example of a light fixture. The vehicle includes the taillight and may be configured to turn on the taillight in a case where a brake operation is performed.

The taillight may include the light emitting apparatus according to the present exemplary embodiment. The taillight may include a protection member for protecting the organic light emitting element. While any transparent material with a relatively high strength may be used as a material of the protection member, the protection member is desirably made of polycarbonate. The polycarbonate may be mixed with at least one selected from the group consisting of a derivative of furandicarboxylic acid derivative and an acrylonitrile derivative.

The vehicle may include a body and a window attached to the body. The window may be a transparent display unless the window is one through which the front and back of the vehicle is checked. The transparent display may include the organic light emitting apparatus according to the present exemplary embodiment. In this case, constituent materials of the organic light emitting element, such as electrodes, are made of transparent components.

The movable object according to the present exemplary embodiment may be a ship, aircraft, or drone. The movable object may include an airframe and a light fixture provided to the airframe. The light fixture may emit light to notify the position of the airframe. The light fixture includes the organic light emitting element according to the present exemplary embodiment.

An example of an application of the display apparatus according to the exemplary embodiment will be described below with reference to FIGS. 14A and 14B. The display apparatus is applicable to, for example, a system that is wearable as a wearable device, such as smart glasses, a head mounted display (HMD), or a smart contact. An imaging display apparatus for use in the application example includes an imaging apparatus configured to photoelectrically convert visible light and a display apparatus configured to emit visible light.

Figure 14A:
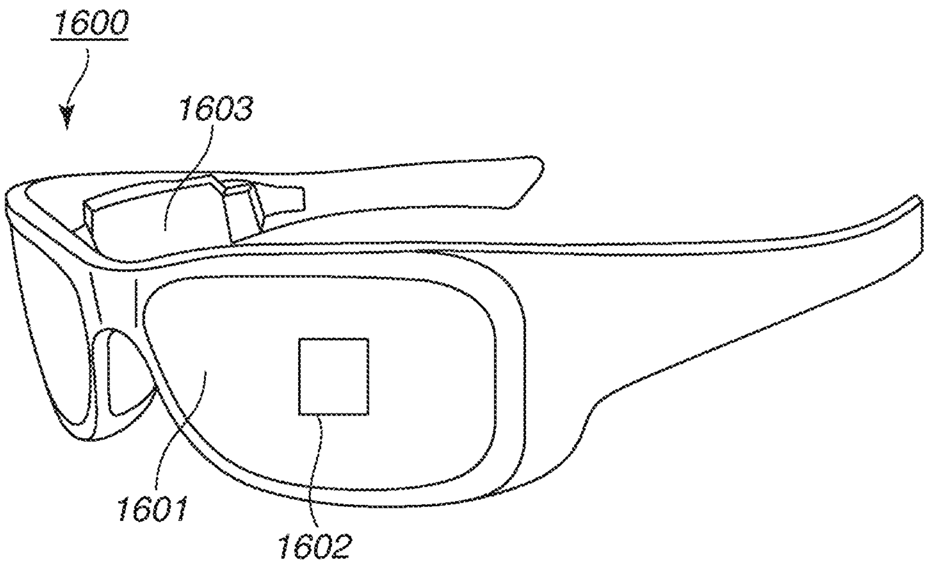
FIG. 14A is a schematic diagram illustrating an example of a wearable device according to an exemplary embodiment of the present invention.

FIG. 14A illustrates glasses 1600 (smart glasses) according to an application example. An imaging apparatus 1602 such as a complementary metal-oxide-semiconductor (CMOS) sensor or a single-photon avalanche diode (SPAD) is provided on the front side of a lens 1601 of glasses 1600. The display apparatus according to the exemplary embodiment is provided on the back side of the lens 1601.

The glasses 1600 further include a control apparatus 1603. The control apparatus 1603 functions as a power supply that supplies power to the imaging apparatus 1602 and the display apparatus according to the exemplary embodiment. The control apparatus 1603 controls operations of the imaging apparatus 1602 and the display apparatus. An optical system for converging light to the imaging apparatus 1602 is formed on the lens 1601.

Figure 14B:
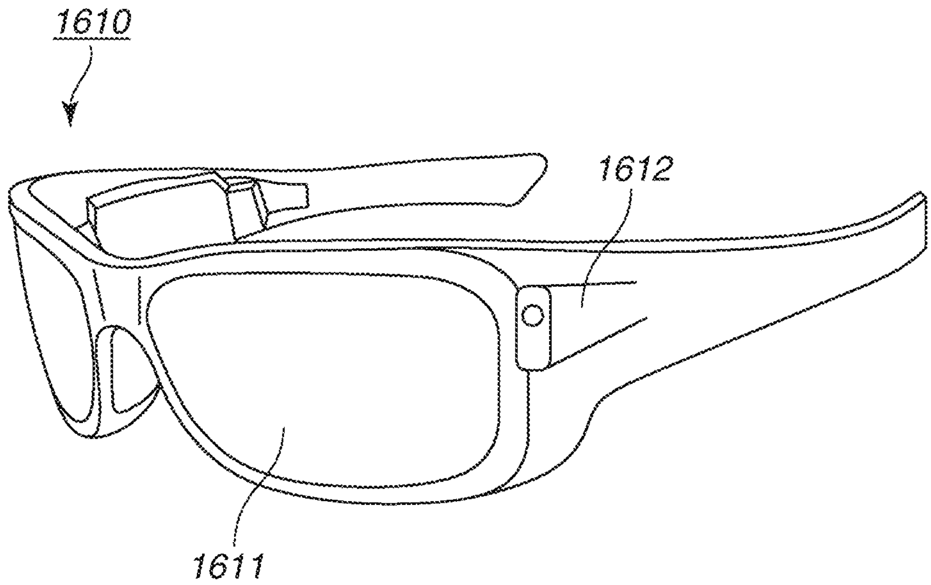
FIG. 14B is a schematic diagram illustrating an example of a wearable device including an imaging apparatus according to an exemplary embodiment of the present invention.

FIG. 14B illustrates glasses 1610 (smart glasses) according to an application example. The glasses 1610 include a control apparatus 1612, and an imaging apparatus that is equivalent to the imaging apparatus 1602 and the display apparatus are installed in the control apparatus 1612. The imaging apparatus in the control apparatus 1612 and an optical system for projecting light emitted from the display apparatus are formed on a lens 1611, and images are projected onto the lens 1611. The control apparatus 1612 functions as a power supply that supplies power to the imaging apparatus and the display apparatus and controls operations of the imaging apparatus and the display apparatus. The control apparatus 1612 may include a gaze detection unit configured to detect a gaze of a wearer. Infrared rays may be used for gaze detection. An infrared light emitting portion may emit red external light to an eyeball of a user gazing at a display image. The emitted red external light that is reflected at the eyeball is detected by an imaging porting including a light receiving element, so that an eyeball image is acquired. Inclusion of a reduction unit configured to reduce light from the infrared light emitting portion to the display unit in a plan view reduces degradation in image quality.

From the eyeball images acquired by the imaging using red external light, a gaze of the user on a display image is detected. Any known method is applicable to the gaze detecting using captured eyeball images. For example, a gaze detection method based on Purkinje images using reflections of radiated light on the cornea may be used.

More specifically, a gaze detection process based on a pupil corneal reflection method is performed. Gaze vectors representing eyeball directions (rotation angle) are calculated based on pupil images and Purkinje images that are included in captured eyeball images with the pupil corneal reflection method, thus detecting a gaze of a user.

The display apparatus according to an exemplary embodiment of the present invention includes an imaging apparatus including light receiving elements, and display images on the display apparatus may be controlled based on user's gaze information from the imaging apparatus.

More specifically, the display apparatus determines, based on the gaze information, a first field-of-view region at which the user gazes and a second field-of-view region other than the first field-of-view region. The first field-of-view region and the second field-of-view region may be determined by a control apparatus of the display apparatus, or first and second field-of-view regions determined by an external control apparatus may be received. In a display region of the display apparatus, the display resolution of the first field-of-view region may be controlled to be higher than the display resolution of the second field-of-view region. Specifically, the resolution of the second field-of-view region may be controlled to be lower than the resolution of the first field-of-view region.

The display region includes a first display region and a second display region different from the first display region, and a region with high priority is selected from the first display region and the second display region based on the gaze information. The first field-of-view region and the second field-of-view region may be determined by the control apparatus of the display apparatus, or first and second field-of-view regions determined by an external control apparatus may be received. The resolution of the region with high priority may be controlled to be higher than the resolutions of regions other than the region with high priority. Specifically, the resolution of a region with relatively low priority may be controlled to be low.

Artificial intelligence (AI) may be used in determining a first field-of-view region or a region with high priority. AI may be a model configured to estimate an angle of a gaze and a distance to an object of the gaze from eyeball images using the eyeball images and a direction in which the eyeball in the images is actually looking at as training data. AI programs may be stored in the display apparatus, the imaging apparatus, or an external apparatus. In a case where an external apparatus stores AI programs, the AI programs are transmitted to the display apparatus via communication.

In a case where display control is performed based on visual detection, the present invention is suitably applicable to smart glasses further including an imaging apparatus configured to image the outside. The smart glasses can display captured external information in real time.

As described above, use of an apparatus including the organic light emitting element according to the present exemplary embodiment enables stable display for a long time with excellent image quality.

The present invention is not limited to the exemplary embodiments described above, and various changes and modifications can be made without departing from the spirit and scope of the present invention. To disclose the scope of the present invention to the public, the following claims are attached.

According to the present invention, a light extraction structure is provided optical interference with the light extraction structure reflected is used, thus providing an organic light emitting element with high radiance in the front direction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A light emitting apparatus comprising:

a substrate;

an insulation layer on a main surface of the substrate;

a light emitting element disposed on a main surface of the insulation layer, including a luminescent material, and having a resonator structure, the luminescent material having a photoluminescence (PL) spectrum with a first peak at a wavelength $\lambda_{PL}$ within a visible light range; and a lens on the light emitting element, wherein the light emitting apparatus includes, between the main surface of the insulation layer and the luminescent material, an electrode configured to supply charge to the luminescent material, and an end portion of the electrode and another end of the electrode are covered with a pixel separation layer, and wherein a resonance peak wavelength $\lambda_{on}$ of an interference spectrum that intensifies light to be emitted in a direction perpendicular to the main surface in the resonator structure, a peak wavelength $\lambda_{EL}$ of EL emission radiated via the lens, and the $\lambda_{PL}$ satisfy the following inequality (1):

$$|\lambda_{EL}-\lambda_{PL}|<|\lambda_{on}-\lambda_{PL}|. \quad (1)$$

2. The light emitting apparatus according to claim 1, wherein, in the PL spectrum, the first peak is a maximum intensity peak in the visible light range.

3. The light emitting apparatus according to claim 1, wherein the PL peak wavelength $\lambda_{PL}$ is the closest wavelength to the $\lambda_{on}$ in the PL peak wavelength.

4. The light emitting apparatus according to claim 1, wherein the Non is longer in wavelength than the PL peak wavelength $\lambda_{PL}$.

5. The light emitting apparatus according to claim 1,
wherein the lens includes an inclined part inclined with respect to the main surface, and
wherein the inclined part refracts, in the direction perpendicular to the main surface, light traveling in a direction that is inclined with respect to the main surface.

6. The light emitting apparatus according to claim 5, wherein an inclination angle of the inclined part with respect to the main surface is greater than or equal to 9° and less than or equal to 60°.

7. The light emitting apparatus according to claim 5, wherein a radiation angle Θeml of the light refracted at the inclined part of the lens in a front direction is greater than 0° and less than 30° with respect to the main surface in a light emitting layer of the light emitting element.

8. The light emitting apparatus according to claim 5, wherein a radiation angle Θeml of the light refracted at the inclined part of the lens in a front direction is greater than or equal to 5° and less than or equal to 20° with respect to the main surface in a light emitting layer of the light emitting element.

9. The light emitting apparatus according to claim 1,
wherein a display region includes a first region including a center portion of the display region and a second region outside of the first region,
wherein the first region includes a third light emitting element, and the second region includes a fourth light emitting element, and
wherein a distance between a midpoint of the lens and a midpoint between an end and another end of the pixel separation layer in the fourth light emitting element is greater than a distance between a midpoint of the lens and a midpoint between an end and another end of the pixel separation layer in the third light emitting element.

10. The light emitting apparatus according to claim 1, further comprising a second light emitting element having a resonator structure different from the resonator structure of the light emitting element, wherein the second light emitting element intensifies light with a wavelength different from the light emitting element.

11. The light emitting apparatus according to claim 10, wherein the light emitting element includes a first optical adjustment layer, the second light emitting element includes a second optical adjustment layer, and the first optical adjustment layer is smaller in thickness than the second optical adjustment layer.

12. The light emitting apparatus according to claim 1, further comprising a second light emitting element different from the light emitting element,
wherein the second light emitting element does not satisfy the inequality (1).

13. The light emitting apparatus according to claim 10,
wherein an emission spectrum of the luminescent material has a first full width at half maximum,
wherein the second light emitting element includes a second luminescent material,
wherein an emission spectrum of the second luminescent material has a second full width at half maximum, and
wherein the second full width at half maximum of the second luminescent material is greater than the first full width at half maximum of the luminescent material.

14. The light emitting apparatus according to claim 13, wherein the second luminescent material is a phosphorescent luminescent material.

15. The light emitting apparatus according to claim 1, wherein the luminescent material of the light emitting element is a fluorescent luminescent material.

16. The light emitting apparatus according to claim 1, further comprising:
a second light emitting element different from the light emitting element; and
a second lens on which light from the second light emitting element is incident, the second lens being different from the lens,
wherein a distance between a midpoint of a light emitting region of the light emitting element in a cross section perpendicular to the main surface and a midpoint of the lens in a direction parallel to the main surface is greater than a distance between a midpoint of a light emitting region of the second light emitting element in the cross section perpendicular to the main surface and a midpoint of the second lens in the direction parallel to the main surface.

17. The light emitting apparatus according to claim 16, further comprising:
a third light emitting element different from the second light emitting element; and
a third lens on which light from the third light emitting element is incident, the third light extraction structure being different from the second light extraction structure,
wherein the distance between the midpoint of the light emitting region of the second light emitting element in the cross section perpendicular to the main surface and the midpoint of the second light extraction structure in the direction parallel to the main surface is greater than a distance between a midpoint of a light emitting region of the third light emitting element in the cross section perpendicular to the main surface and a midpoint of the third light extraction structure in the direction parallel to the main surface.

18. A display apparatus comprising:
the light emitting apparatus according to claim 1; and
a display control unit connected to the light emitting apparatus.

19. An imaging apparatus comprising:
an optical unit including a plurality of lenses;
an image sensor configured to receive light transmitted through the optical unit; and
a display unit configured to display an image imaged by the image sensor,
wherein the display unit includes the light emitting apparatus according to claim 1.

20. An electronic device comprising:
a display unit including the light emitting apparatus according to claim 1;
a housing including the display unit; and
a communication unit disposed in the housing and configured to externally communicate.

21. A light emitting apparatus comprising:
an insulation layer;
a light emitting element disposed on a main surface of the insulation layer, including a luminescent material, and having a resonator structure, the luminescent material having a photoluminescence (PL) spectrum with a first peak at a wavelength $\lambda_{PL}$ within a visible light range; and a lens on the light emitting element, wherein the light emitting apparatus includes, between the main surface of the insulation layer and the luminescent material, an electrode configured to supply charge to the luminescent material, and an end portion of the electrode and another end of the electrode are covered with a pixel separation layer, and wherein a resonance peak wavelength $\lambda_{on}$ of an interference spectrum that intensifies light to be emitted in a direction perpendicular to the main surface in the resonator structure, a resonance peak wavelength $\lambda_{off}$ of an interference spectrum that intensifies light emitted in a direction perpendicular to the main surface as a result of refraction in the lens, and the $\lambda_{PL}$ satisfy the following inequality (2):

$$|\lambda_{off} - \lambda_{PL}| < |\lambda_{on} - \lambda_{PL}|. \quad (2)$$

22. The light emitting apparatus according to claim 21, wherein the PL spectrum of the luminescent material has a second peak that is smaller in emission intensity than the first peak and has a wavelength $\lambda_{PL2}$, and the following inequality (3) is satisfied:

$$|\lambda_{off} - \lambda_{PL}| \leq |\lambda_{on} - \lambda_{PL2}|. \quad (3)$$

23. The light emitting apparatus according to claim 22, wherein, in the PL spectrum, the first peak is a maximum intensity peak in the visible light range, and the second peak is a peak with the second highest intensity after the first peak.

24. The light emitting apparatus according to claim 21, wherein the PL peak wavelength $\lambda_{PL}$ is the closest peak wavelength to the $\lambda_{on}$ in the PL peak wavelength.

25. The light emitting apparatus according to claim 21, wherein, in the light emitting element, a midpoint of the lens in a direction parallel to the main surface and a midpoint between the end and the another end of the pixel separation layer in a cross section in a direction perpendicular to a main surface of a substrate do not overlap in a plan view.

26. The light emitting apparatus according to claim 25, further comprising a light emitting portion including the luminescent material, wherein, in a case where the midpoint of the lens in the direction parallel to the main surface and the midpoint between the end and the other end of the pixel separation layer in the cross section in the direction perpendicular to the main surface of the substrate do not overlap in the plan view, an optical distance of the $\lambda_{off}$ is a distance between the light emitting portion and a portion of a curved surface of the lens that is far from the light emitting portion in the cross section.

27. The light emitting apparatus according to claim 21, further comprising a second light emitting element different from the light emitting element, wherein the second light emitting element does not satisfy the inequality (2).

* * * * *